(12) United States Patent
Chen et al.

(10) Patent No.: US 12,183,577 B2
(45) Date of Patent: Dec. 31, 2024

(54) METAL HARD MASKS FOR REDUCING LINE BENDING

(71) Applicant: Taiwan Semiconductor Manufacturing Co., Ltd., Hsinchu (TW)

(72) Inventors: Chun-Kai Chen, Kaohsiung (TW); JeiMing Chen, Tainan (TW); Tze-Liang Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 264 days.

(21) Appl. No.: 17/332,553

(22) Filed: May 27, 2021

(65) Prior Publication Data

US 2022/0102143 A1   Mar. 31, 2022

Related U.S. Application Data

(60) Provisional application No. 63/084,823, filed on Sep. 29, 2020.

(51) Int. Cl.
| | |
|---|---|
| *H01L 21/033* | (2006.01) |
| *H01L 21/311* | (2006.01) |
| *H01L 21/768* | (2006.01) |

(52) U.S. Cl.
CPC .... *H01L 21/0332* (2013.01); *H01L 21/31144* (2013.01); *H01L 21/76802* (2013.01); *H01L 21/76877* (2013.01)

(58) Field of Classification Search
CPC ........... H01L 21/0332; H01L 21/31144; H01L 21/76802; H01L 21/76877; H01L 21/0337; H01L 21/76813; H01L 21/76816; H01L 21/76811
See application file for complete search history.

(56) References Cited

U.S. PATENT DOCUMENTS

| | | | | |
|---|---|---|---|---|
| 7,871,909 | B1 * | 1/2011 | Wang | H01L 21/76816 438/584 |
| 9,679,804 | B1 * | 6/2017 | Chen | H01L 21/76811 |
| 10,340,141 | B2 * | 7/2019 | Peng | H01L 21/0332 |
| 10,867,804 | B2 * | 12/2020 | Su | H01L 21/0337 |
| 10,867,842 | B2 | 12/2020 | Wang et al. | |
| 10,957,580 | B2 | 3/2021 | Liu et al. | |

(Continued)

FOREIGN PATENT DOCUMENTS

| | | |
|---|---|---|
| DE | 102017128235 A1 | 10/2018 |
| KR | 20190024540 A | 3/2019 |

(Continued)

*Primary Examiner* — Bac H Au
(74) *Attorney, Agent, or Firm* — Slater Matsil, LLP

(57) ABSTRACT

A method includes forming a metal-containing hard mask layer over a dielectric layer, wherein the metal-containing hard mask layer has a Young's modulus greater than about 400 MPa and a tensile stress greater than about 600 MPa, patterning the metal-containing hard mask layer to form an opening in the metal-containing hard mask layer, and etching the dielectric layer using the metal-containing hard mask layer as an etching mask. The opening extends into the dielectric layer. The opening is filled with a conductive material to form a conductive feature. The metal-containing hard mask layer is then removed.

19 Claims, 27 Drawing Sheets

(56) References Cited

U.S. PATENT DOCUMENTS

| | | | |
|---|---|---|---|
| 11,244,858 B2 | 2/2022 | Huang et al. | |
| 2009/0176378 A1 | 7/2009 | Wang | |
| 2011/0135557 A1* | 6/2011 | Rangarajan | H01L 21/02112 |
| | | | 257/E21.24 |
| 2012/0164846 A1 | 6/2012 | Ha et al. | |
| 2014/0113438 A1* | 4/2014 | Usami | H01L 21/76813 |
| | | | 438/488 |
| 2014/0193974 A1* | 7/2014 | Lee | H01L 21/0332 |
| | | | 438/669 |
| 2015/0339422 A1* | 11/2015 | Greco | H01L 21/76816 |
| | | | 716/55 |
| 2016/0020109 A1 | 1/2016 | Yoo | |
| 2018/0308749 A1* | 10/2018 | Yang | H01L 21/31144 |
| 2019/0157094 A1* | 5/2019 | Lin | H01L 21/76811 |
| 2019/0333806 A1* | 10/2019 | Huang | H01L 21/0332 |
| 2020/0006082 A1* | 1/2020 | Su | H01L 21/02178 |
| 2020/0027780 A1* | 1/2020 | Briggs | H01L 21/76816 |
| 2020/0052196 A1* | 2/2020 | Shen | H01F 41/34 |
| 2020/0263309 A1* | 8/2020 | Tanaka | H01L 21/32137 |
| 2022/0102212 A1* | 3/2022 | Su | H01L 21/76897 |

FOREIGN PATENT DOCUMENTS

| | | |
|---|---|---|
| KR | 20190038241 A | 4/2019 |
| TW | 200841391 A | 10/2008 |
| TW | 202018764 A | 5/2020 |

* cited by examiner

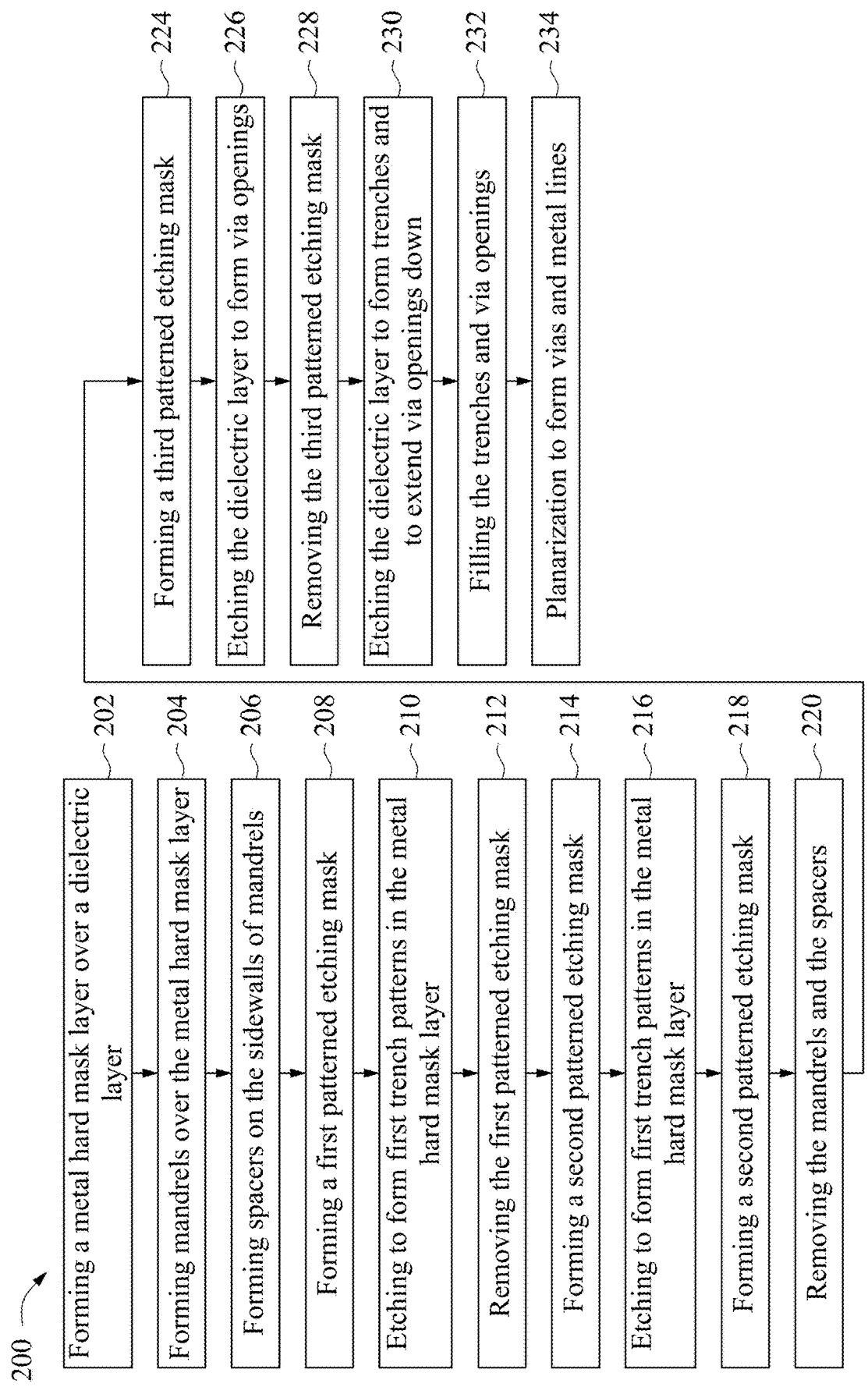

METAL HARD MASKS FOR REDUCING LINE BENDING

PRIORITY CLAIM AND CROSS-REFERENCE

This application claims the benefit of the following provisionally filed U.S. Patent application No. 63/084,823, filed on Sep. 29, 2020, and entitled "Advanced properties of metal Hardmask Enhanced Patterning Transfer," which application is hereby incorporated herein by reference.

BACKGROUND

Metal lines and vias are used for interconnecting integrated circuits such as transistors to form functional circuits. With the reduction of the sizes of devices, metal lines and vias are also becoming smaller. The formation of the metal lines may include forming a hard mask layer over the dielectric layer in which the metal lines are formed, patterning the dielectric layer using the hard mask layer as an etching mask to form trenches, and filling the trenches with metal to form metal lines.

With the reduction in the line widths and the reduction in the spacings between the metal lines, the portions of dielectric layer between the trenches become narrower and may be distorted. The distortion causes problems in the gap-filling process to fill the trenches with metallic materials. When some parts of the trenches are not filled with metal, line-breaking may occur.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 18 illustrates a process flow for forming an interconnect structure in accordance with some embodiments.

DETAILED DESCRIPTION

Figure 1:
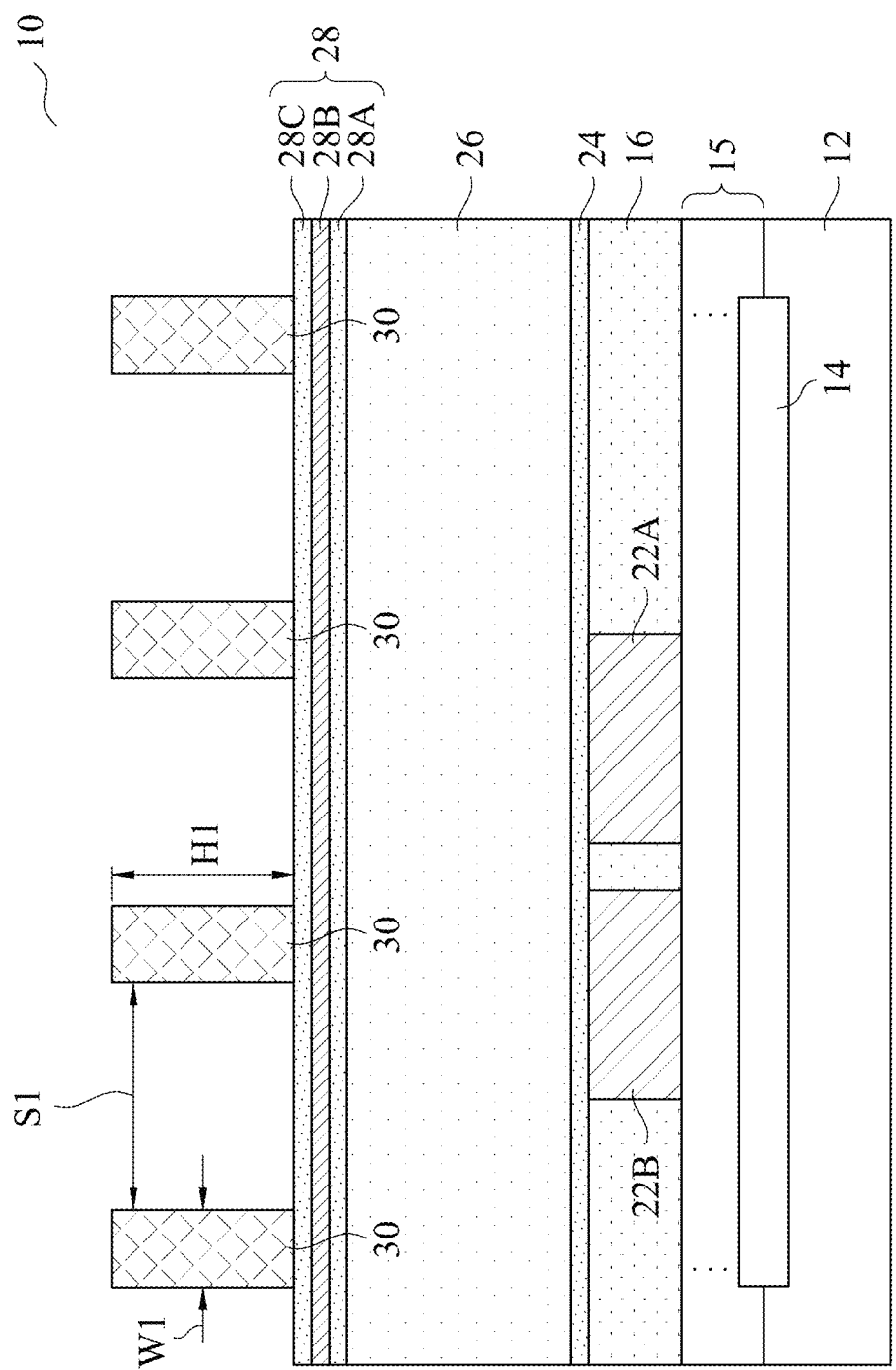
FIGS. 1-2, 3A, 3B, 4-5, 6A, 6B, 7-8, 9A, 9B, 9C, 10A, 10B, 10C, 11A, 11B, 12A, 12B, 13-14, 15A, 15B, and 16 illustrate the cross-sectional views and top views of intermediate stages in the formation of an interconnect structure including metal lines and vias in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An interconnect structure including metal lines and vias and the method of forming the same are provided. In accordance with some embodiments of the present disclosure, a metal hard mask layer is formed over a dielectric layer. The metal hard mask layer is formed of a selected material using selected process conditions, so that the metal hard mask layer has a high Young's modulus and a high tensile stress. The metal hard mask layer, when used for forming trenches, may reduce the distortion of the remaining dielectric layer between the trenches, and hence result in improved gap-filling of metal in the trenches, and result in reduced line-width roughness. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-2, 3A, 3B, 4-5, 6A, 6B, 7-8, 9A, 9B, 10A, 10B, 10C, 11A, 11B, 12A, 12B, 13-14, 15A, 15B, and 16 illustrate the cross-sectional views of intermediate stages in the formation of an interconnect structure in accordance with some embodiments of the present disclosure. The corresponding processes are also reflected schematically in the process flow 200 as shown in FIG. 18.

FIG. 1 illustrates a cross-sectional view of wafer 10, wherein the illustrated portion is a part of a device die in wafer 10. In accordance with some embodiments of the present disclosure, wafer 10 is a device wafer including active devices such as transistors and/or diodes, and possibly passive devices such as capacitors, inductors, resistors, and/or the like. In accordance with alternative embodiments, wafer 10 may be an interposer wafer free from active devices, which may include, or may be free from, passive devices.

In accordance with some embodiments of the present disclosure, wafer 10 includes semiconductor substrate 12 and the features formed at a top surface of semiconductor substrate 12. Semiconductor substrate 12 may be formed of crystalline semiconductor material such as silicon, germanium, silicon germanium, and/or a III-V compound semiconductor such as GaAsP, AlInAs, AlGaAs, GaInAs, GaInP, GaInAsP, or the like. Semiconductor substrate 12 may also be a bulk silicon substrate or a Silicon-On-Insulator (SOI) substrate. Shallow Trench Isolation (STI) regions (not shown) may be formed in semiconductor substrate 12 to isolate the active regions in semiconductor substrate 12. Although not shown, through-vias may be formed to extend into semiconductor substrate 12, wherein the through-vias are used to electrically inter-couple the features on opposite sides of semiconductor substrate 12. Active devices 14, which may include transistors, are formed at the top surface of semiconductor substrate 12.

Further illustrated in FIG. 1 is dielectric layer 16. In accordance with some embodiments of the present disclosure, dielectric layer 16 is formed of a low-k dielectric material having a dielectric constant (k-value) lower than about 3.5, lower than about 3.0, or even lower. Dielectric layer 16 may be formed of Black Diamond (a registered trademark of Applied Materials), a carbon-containing low-k dielectric material, Hydrogen SilsesQuioxane (HSQ), MethylSilsesQuioxane (MSQ), and/or the like. In accordance with some embodiments of the present disclosure, the formation of dielectric layer 16 includes depositing a porogen-containing dielectric material and then performing a curing process to drive out the porogen, and hence the remaining dielectric layer 16 is porous.

Conductive features 22A and 22B are formed in dielectric 16. In accordance with some embodiments, each of conductive features 22A and 22B includes a diffusion barrier layer and a copper-containing material over the diffusion barrier layer. The diffusion barrier layer may be formed of titanium, titanium nitride, tantalum, tantalum nitride, or the like, and has the function of preventing copper in copper-containing material from diffusing into dielectric 16. Alternatively, conductive features 22A and 22B may be barrier-less, and may be formed of cobalt, tungsten, or the like. Conductive features 22A and 22B may have a single damascene structure or a dual damascene structure.

In accordance with some embodiment, dielectric layer 16 is an Inter-Metal Dielectric (IMD) layer, and conductive features 22A and 22B are metal lines and/or vias. In accordance with alternative embodiments, dielectric layer 16 is an inter-layer dielectric layer, and conductive features 22A and 22B are contact plugs. There may be, or may not be, additional features between dielectric layer 16 and devices 14, and the additional features are represented as structure 15, which may include dielectric layers such as a contact etch stop layer(s), an inter-layer dielectric, an etch stop layer(s), and an IMD(s). Structure 15 may also include contact plugs, vias, metal lines, etc.

Dielectric layer 24 is deposited over dielectric layer 16 and conductive features 22A and 22B. Dielectric layer 24 may be used as an Etch Stop Layer (ESL), and hence is referred to as etch stop layer or ESL 24 throughout the description. Etch stop layer 24 may include a nitride, a silicon-carbon based material, a carbon-doped oxide, or a metal-containing dielectric such as SiCN, SiOCN, SiOC, $AlO_x$, AlN, AlCN, or the like, or combinations thereof. Etch stop layer 24 may be a single layer formed of a homogeneous material, or a composite layer including a plurality of dielectric sub-layers. In accordance with some embodiments of the present disclosure, etch stop layer 24 includes an aluminum nitride (AlN) layer, a SiOC layer over the AlN layer, and an aluminum oxide ($AlO_x$) layer over the SiOC layer.

Dielectric layer 26 is deposited over ESL 24. In accordance with some exemplary embodiments of the present disclosure, dielectric layer 26 is formed of a silicon-containing dielectric material such as silicon oxide. Dielectric layer 26 may also be formed of a low-k dielectric material, and hence is referred to as low-k dielectric layer 26 hereinafter. Low-k dielectric layer 26 may be formed using a material selected from the same (or different) group of candidate materials for forming dielectric layer 16. When selected from the same group of candidate materials, the materials of dielectric layers 16 and 26 may be the same as each other or different from each other.

Mask layers 28A, 28B, and 28C are formed over dielectric layer 26 in accordance with some embodiments of the present disclosure. It is appreciated that the illustrated mask layers 28A, 28B, and 28C are examples, and different layer schemes may be used. Mask layers 28A, 28B, and 28C are individually and collectively referred to as mask layers 28 hereinafter. In accordance with some embodiments, mask layers 28A and 28C are formed of or comprise a non-metal-containing dielectric such as silicon oxide, which may be formed, for example, using tetra ethyl ortho silicate (TEOS) as a precursor. The formation methods may include Chemical Vapor Deposition (CVD), Plasma Enhance Chemical Vapor Deposition (PECVD), Sub Atmosphere Chemical Vapor Deposition (SACVD), or the like.

Mask layer 28B is deposited after the deposition of mask layer 28A, and before the deposition of mask layer 28C. The respective process is illustrated as process 202 in the process flow 200 as shown in FIG. 18. Mask layer 28B may be a metal hard mask layer comprising a metal, which may be tungsten (W), ruthenium (Ru), or the like, or combination thereof. Accordingly, mask layer 28B is alternatively referred to as metal hard mask layer 28B hereinafter. The metal in metal hard mask layer 28B may be elemental (not a compound) or in the form of a metal compound. For example, metal hard mask layer 28B may be an elemental tungsten layer, an elemental ruthenium layer, a tungsten alloy layer, or a ruthenium alloy layer. Metal hard mask layer 28B may also be a compound layer of the metal and other elements such as carbon, nitrogen, or combinations thereof. For example, when the metal is tungsten, the compound may be $W_xN_yC_z$, $W_xN_y$, $W_xC_z$, or the like, wherein x, y, and z are relative atomic numbers. Similarly, when the metal comprises more than one metal such as W and Ru, metal hard mask layer may include the carbide of the metals, nitride of the metals, or carbo-nitride of the metals. Mask layer 28B may be a single-layer formed of homogenous material, which is selected from the aforementioned materials. Alternatively, mask layer 28B may have a composite structure including a plurality of sub layers, which may be selected from the aforementioned materials. For example, Mask layer 28B may include a $W_xN_yC_z$ layer sandwiched between two $W_xN_y$ layers or two $W_xC_z$ layers. Forming the composite structure may result in improved resistance to etching for some etching chemical and improved etching selectivity, for example, relative to the underlying mask layer 28A (in the step shown in FIGS. 4 and 7). The structure and the material of metal hard mask layer 28B may also be selected to suit to the underlying dielectric layer 26, so that the line distortion and line-width roughness may be reduced. Mask layers 28 may be formed using PECVD, Atomic Layer Deposition (ALD), CVD, Physical Vapor Deposition (PVD), or the like. Mask layers 28 may have a thickness in the range between about 50 Å and about 500 Å.

In accordance with some embodiments, the formation of metal hard mask layer 28B is performed using process gases including a precursor as a first gas, for example, when PECVD or other chemical vapor deposition methods are used. The precursor may include $WF_6$, $WCl_6$, or the like, or combinations thereof if the metal hard mask layer is tungsten-containing. The precursor may include $RuF_3$, $RuCl_3$, or the like, or combinations thereof if the metal hard mask layer is ruthenium-containing. The process gas may further include a second gas, which may be a carbon-containing, nitrogen-containing, or a carbon-nitrogen-containing gas such as $N_2$, $NH_3$, alkyne, alkane, alkene, or the like, or combinations thereof. In the embodiments in which PVD is used, a tungsten target, a tungsten carbide target, a ruthenium target, a ruthenium carbide target, or the like, may be used, depending on the material of metal hard mask layer 28B. In the PECVD, CVD, and/or PVD, process gases such as Ar, He, $N_2$, $H_2$, or the like, or combinations thereof, may be added.

To reduce the bending of metal lines (formed in subsequent processes) and the portions of dielectric layer between the metal lines, metal hard mask layer 28B is deposited to have a high Young's modulus, for example, greater than about 400 MPa, and may be in the range between about 400 MPa and about 1,000 MPa, and/or in the range between about 500 MPa and about 1,000 MPa. The formation process of metal hard mask layer 28B is adjusted to increase the Young's modulus of metal hard mask layer 28B to a great value, close to about 1,000 MPa, or higher than 1,000 MPa. For example, the deposition rate may be reduced to form a denser metal hard mask layer 28B, and hence with a higher Young's modulus.

In addition, to reduce the bending of metal lines and the portions of dielectric layer between the metal lines, metal hard mask layer 28B is also deposited to have a high tensile stress. In accordance with some embodiments, the tensile stress is greater than about 600 MPa or greater than about 1,000 MPa, and may be in the range between about 600 MPa and about 2,000 MPa, in the range between about 1,000 MPa and about 2,000 MPa, or between about 1,300 MPa and about 2,000 MPa. The formation process of metal hard mask layer 28B is adjusted to increase the tensile stress of metal hard mask layer 28B to a great value, for example, close to about 1,000 MPa or higher than 1,000 MPa. In accordance with some embodiments in which PECVD is used, the plasma power may be in the range between about 100 watts and about 3,000 watts, and may be adjusted to a selected range to increase the tensile stress. The frequency of the RF power may include the frequency of at 27 MHz, 13 MHz, 430 KHz, 400 KHz, or the combinations thereof.

Figure 17:
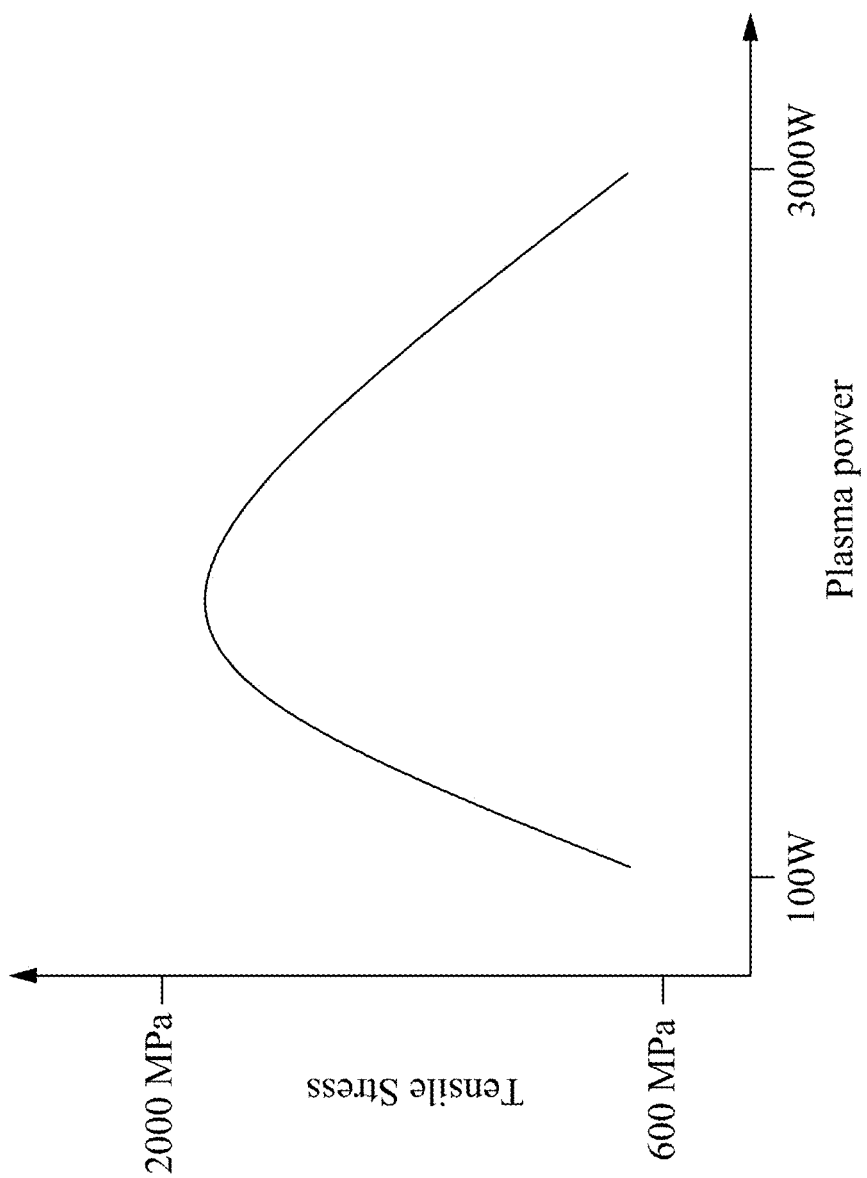
FIG. 17 illustrates a graph showing the tensile stress in metal hard mask layers as a function of plasma power in accordance with some embodiments.

As aforementioned, the process conditions for depositing metal hard mask layer 28B may be adjusted to increase the tensile stress of metal hard mask layer 28B. For example, FIG. 17 illustrates an example correlation between the normalized plasma power used for depositing metal hard mask layer 28B and the resulting normalized tensile stress in metal hard mask layer 28B. It is appreciated that the illustrated figure is an example, and the correlation may be affected by other factors such as the material of metal hard mask layer 28B, the bias power, the deposition temperature, whether there is the ion bombardment by carrier gas, such as He or Ar etc.. The trend, however, may still hold. In FIG. 17, it is shown that the tensile stress may be low at a low plasma power, and with the increase of the plasma power, the tensile stress increases gradually. When the tensile stress reaches a highest point, with the further increase in the plasma power, the tensile stress reduces again. Accordingly, the plasma power is to be selected with a medium value that is not too high and not too low to achieve the high tensile stress.

Since the Young's modulus and the tensile stress of metal hard mask layer 28B may be affected by various factors such as the materials and their compositions (the elements and the atomic percentages of the elements), and by process conditions such as plasma power, deposition rate, temperature, or the like, a plurality of samples may be manufactured to deposit sample metal hard mask layers 28B. The plurality of samples may be formed using different combinations of materials and process conditions, as aforementioned. The optimal material (and the optimal composition of the material) and optimal process conditions leading to a high Young's module and a high tensile stress may be determined, and are used in the manufacturing process.

Next, a plurality of mandrels 30 are formed over mask layers 28. The respective process is illustrated as process 204 in the process flow 200 as shown in FIG. 18. In accordance with some embodiments, mandrels 30 are formed as a plurality of parallel strips, for example, as shown in the top view shown in FIG. 3B. Mandrels 30 may be formed of or comprise amorphous silicon, amorphous carbon, tin oxide, or the like. In accordance with some embodiments, the widths W1 of mandrels 30 (FIG. 1) may be smaller than about 20 nm, and may be in the range between about 5 nm and about 20 nm. Spacing S1 between neighboring mandrels 30 may be about 2.5 times to about 4 times width W1. The height H1 of mandrels 30 may be in the range between about 10 nm and about 40 nm, and may be in the range between about 25 nm and about 40 nm in accordance with some embodiments. The formation of mandrels 30 may include depositing a blanket layer, which may be a planar layer having a uniform thickness, and then performing an etching process to pattern the blanket layer and to form mandrels 30.

Figure 2:
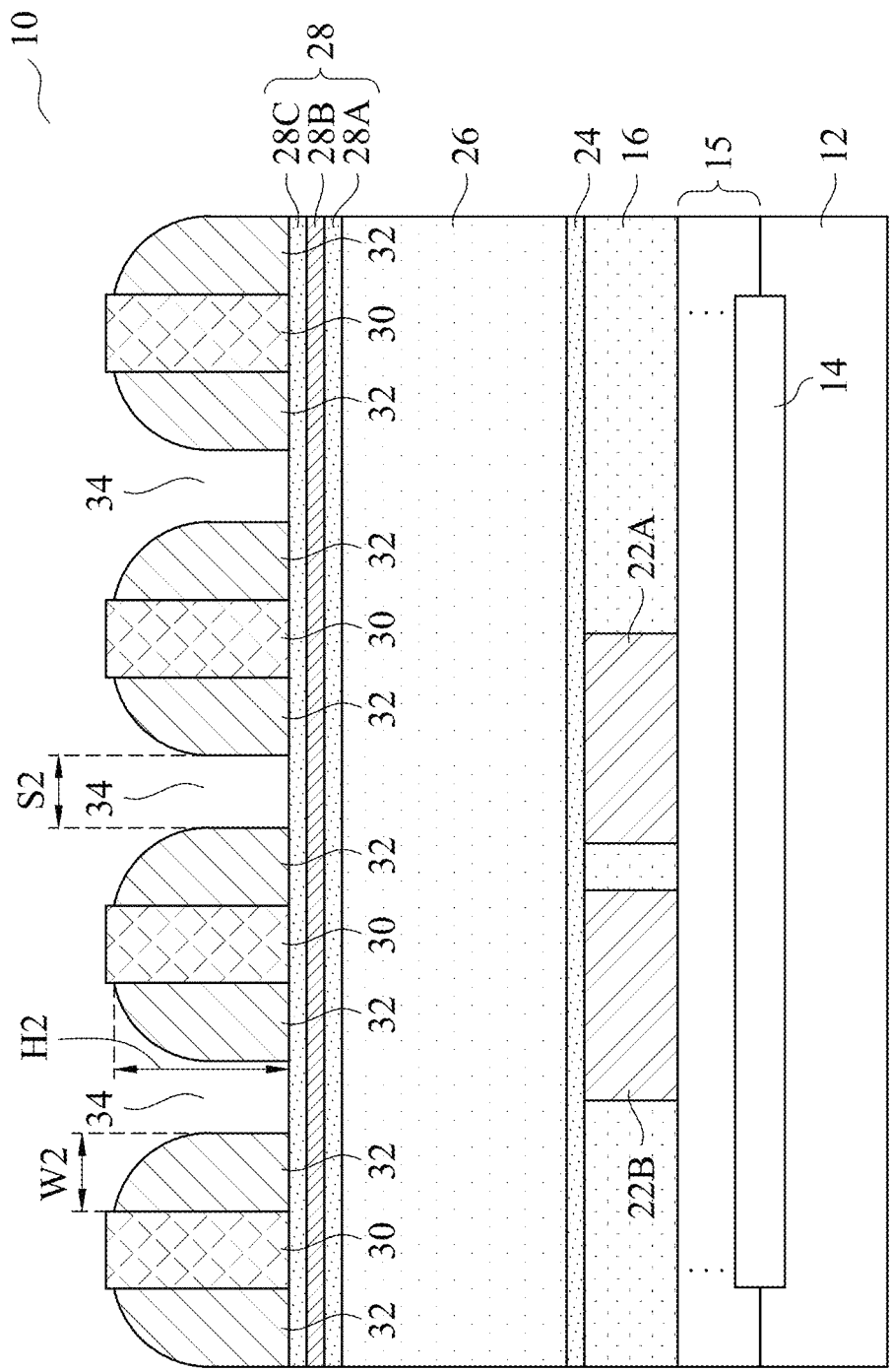

Referring to FIG. 2, spacers 32 are formed. The respective process is illustrated as process 206 in the process flow 200 as shown in FIG. 18. In accordance with some embodiments, spacers 32 are formed of or comprise a metal-containing material such as a metal oxide or a metal nitride, for example, titanium oxide, titanium nitride, or the like. The widths W2 of spacers 32 may be in the range between about 5 nm and about 20 nm. The height H2 of spacers 32 is equal to or slightly smaller than (for example, between about 62 percent and 100 percent) the height H1 of mandrels 30. Height H2 may be in the range between about 20 nm and about 40 nm, and may be in the range between about 25 nm and about 40 nm. Height H2 is further greater than width W2 of spacers 32, and may be greater than about 1.5 times or two times width W2. The formation process of spacers 32 may include performing a conformal deposition process to form a conformal spacer layer, which includes vertical portions on the sidewalls of mandrels 30, top horizontal portions on top of mandrels 30, and bottom horizontal portions between the vertical portions. An anisotropic etching process is then preformed to remove the top horizontal portions and the bottom horizontal portions, and leaving the vertical portions, which are spacers 32. In accordance with some embodiments, the anisotropic etching process is performed using etching gases such as $Cl_2$, HBr, $CH_4$, or the like, or combinations thereof. Carrier gases such as $N_2$, argon, or the like, may also be added into the etching gases. The spacers 32 formed on the neighboring mandrels 30 have spaces 34 in between, which may have spacings S2 in the range between about 0.5 W1 and about 1.5 W2.

Figure 3A:
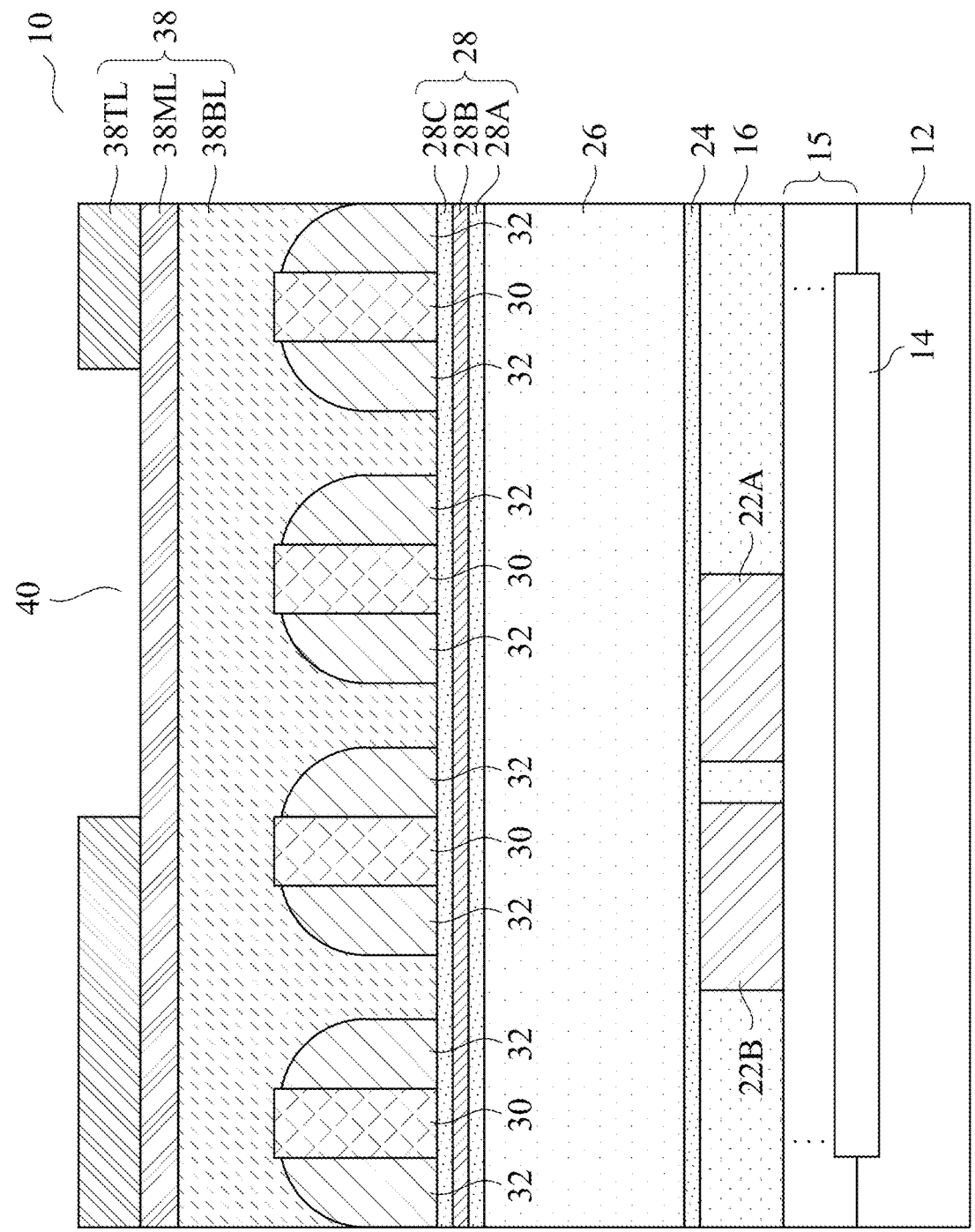

FIGS. 3A, 3B, 4 and 5 illustrate the formation of first trench patterns in metal hard mask layer 28B in accordance with some embodiments. The respective processes may also be referred to as a first patterning process in a double-patterning process. Referring to FIG. 3A, an etching mask 38, which may be a tri-layer, is formed. The respective process is illustrated as process 208 in the process flow 200 as shown in FIG. 18. Etching mask 38 may include bottom layer (also sometimes referred to as an under layer) 38BL, middle layer 38ML over bottom layer 38BL, and top layer 38TL (also sometimes referred to as an upper layer) over middle layer 38ML. In accordance with some embodiments, bottom layer 38BL and top layer 38TL are formed of photo resists, with the bottom layer 38BL being cross-linked already. Middle layer 38ML may be formed of an inorganic material, which may be a nitride (such as silicon nitride), an oxynitride (such as silicon oxynitride), an oxide (such as silicon oxide), or the like. Middle layer 38ML has a high etching selectivity with relative to top layer 38TL and bottom layer 38BL, and hence top layer 38TL may be used as an etching mask for patterning middle layer 38ML, and middle layer 38ML may be used as an etching mask for patterning bottom layer 38BL. Top layer 38TL is patterned to form opening 40, which is used to define trenches in low-k dielectric layer 26. The lithography process in the patterning may be performed using an extreme Ultra-Violet (EUV) light, for example, with 193 nm wavelength.

Figure 3B:
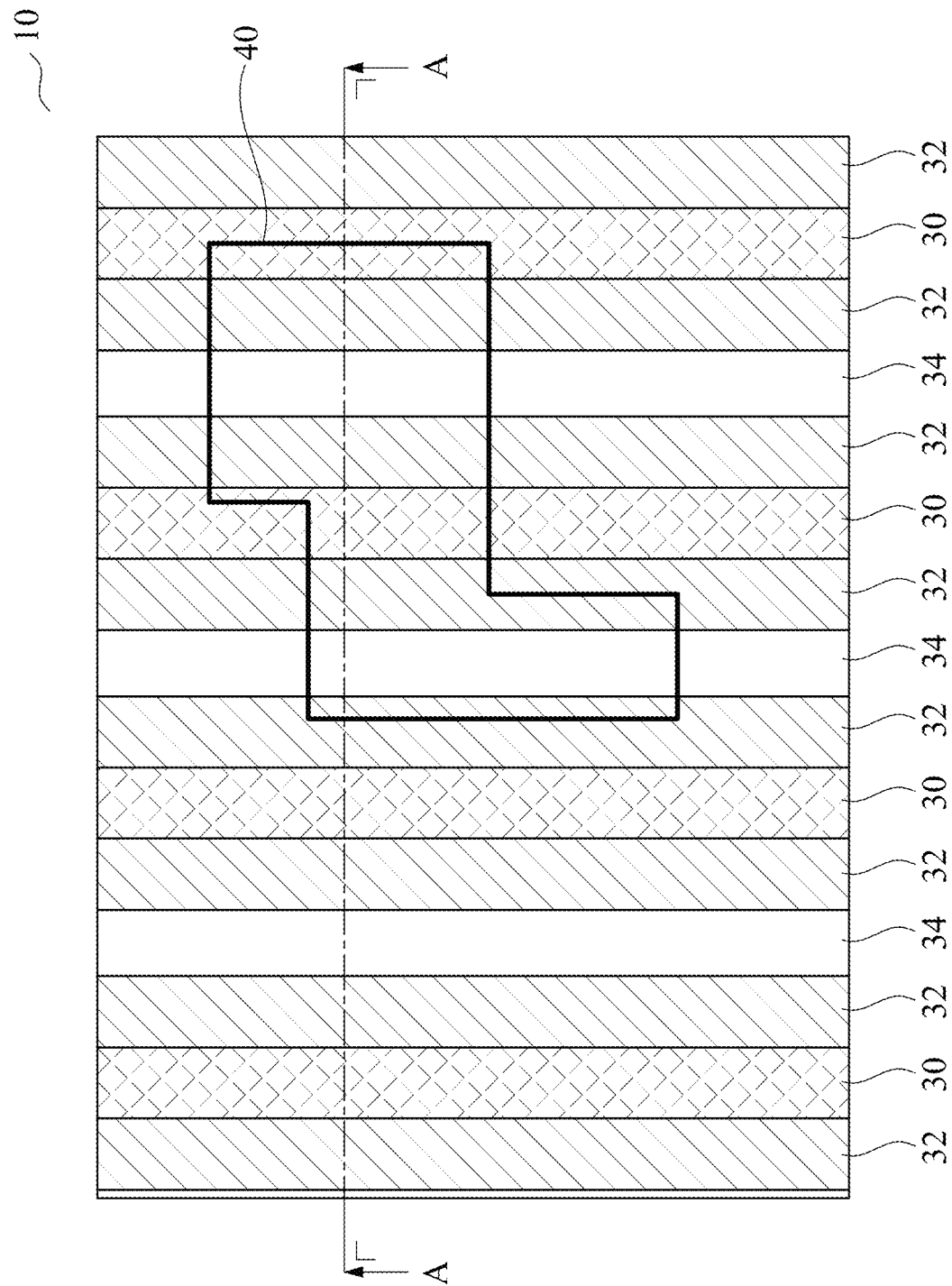

FIG. 3B illustrates a top view of the structure shown in FIG. 3A. The cross-sectional view shown in FIG. 3A is obtained from the reference cross-section A-A in FIG. 3B. Etching mask 38 is formed throughout the illustrated region in wafer 10, with openings 40 (FIG. 3B) formed in etching mask 38. Openings 40 cross the spaces 34, with each of spaces 34 being between two neighboring spacers 32.

Figure 4:
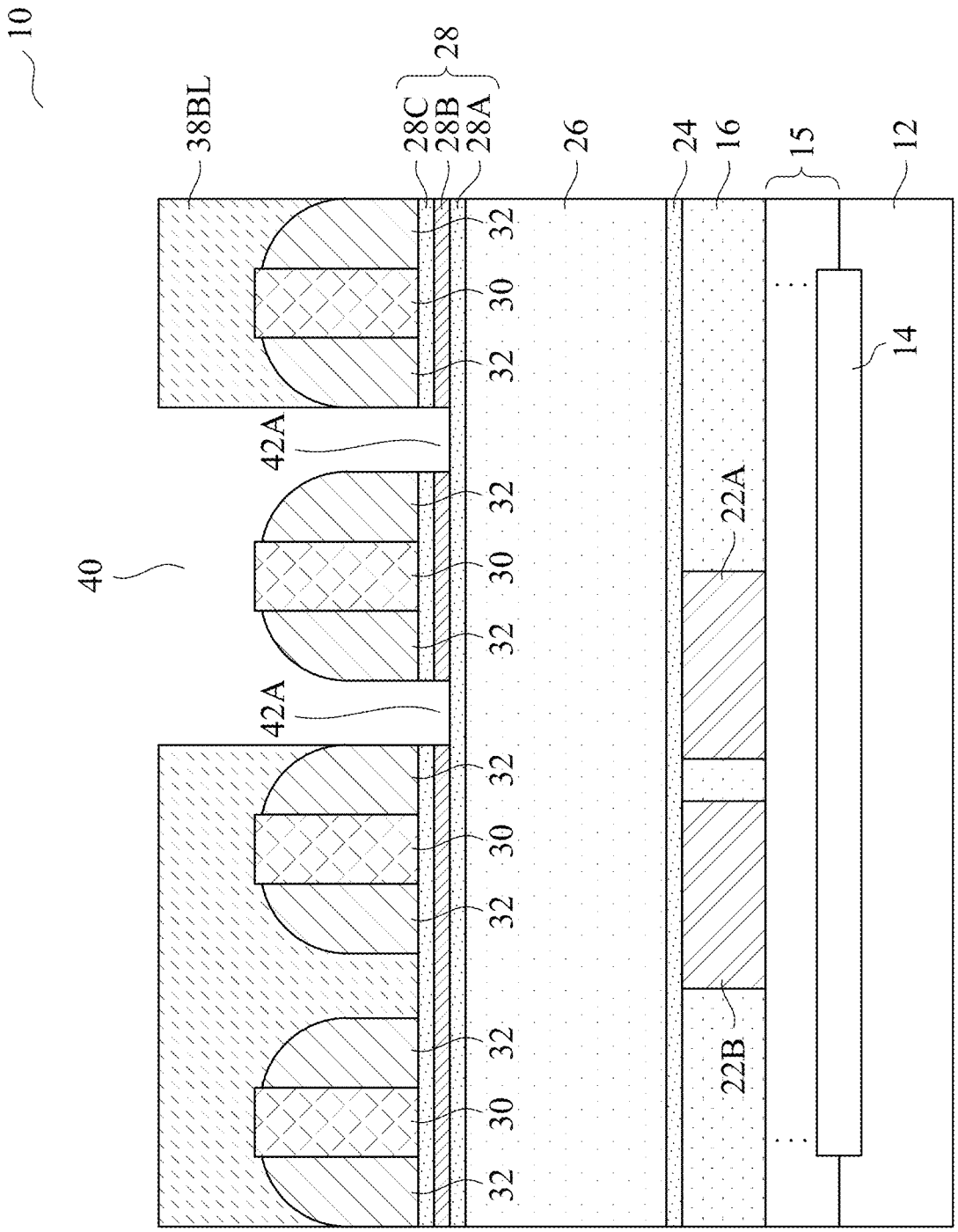

Next, middle layer 38ML (FIG. 3A) is etched using the patterned top layer 38TL as an etching mask, so that the opening 40 extends into middle layer 38ML. After middle layer 38ML is etched-through, bottom layer 38BL is further patterned through etching, during which middle layer 38ML is used as an etching mask. During the patterning of bottom layer 38BL, top layer 38TL is consumed. Middle layer 38ML may be partially or fully consumed during the patterning of bottom layer 38BL. In the patterning of bottom layer 38BL, opening 40 extends downwardly, revealing mandrel 30 and spacers 32. The resulting structure is shown in FIG. 4.

Figure 5:
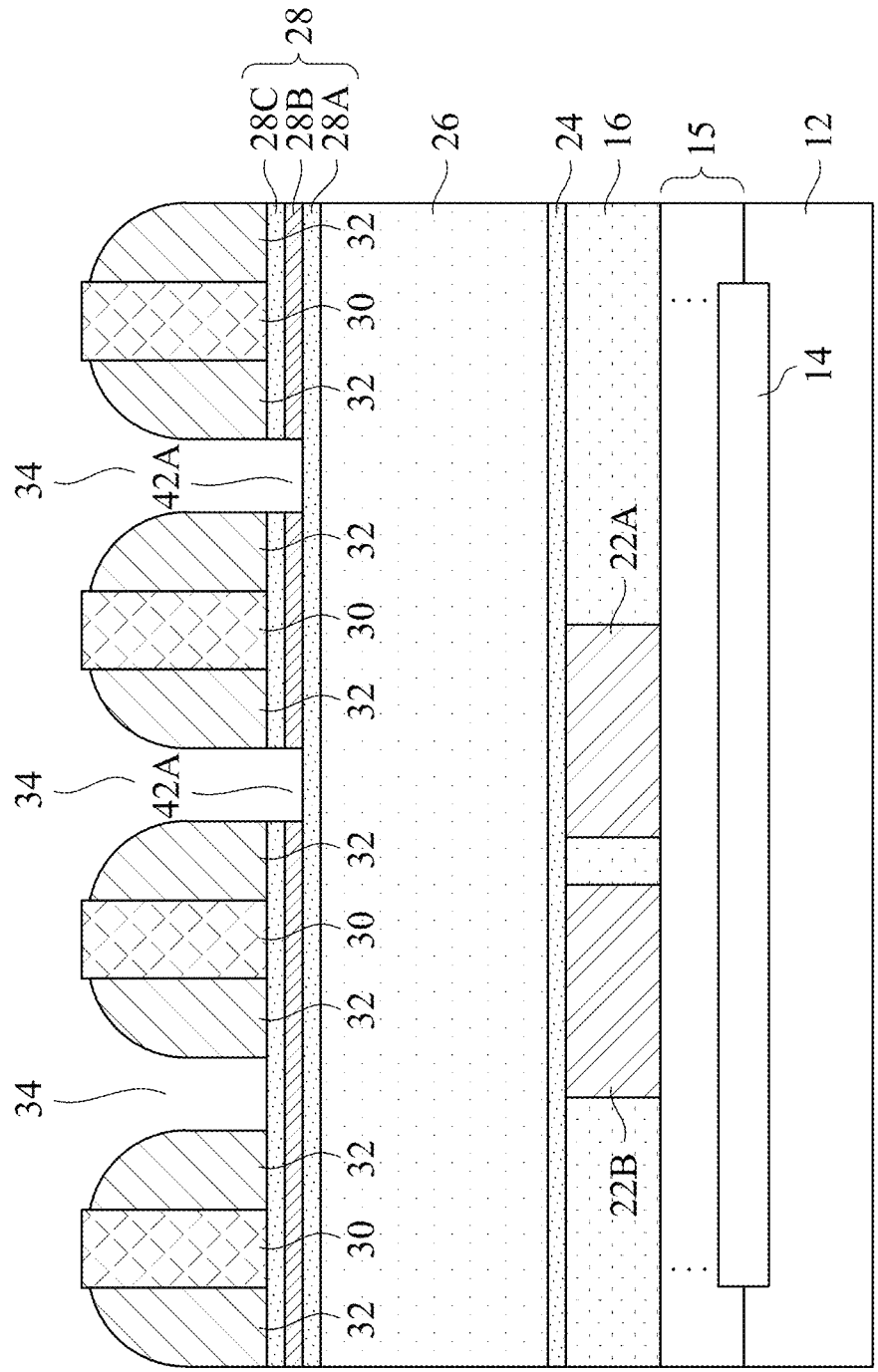

The etching is continued to etch-through hard mask layer 28C and metal hard mask layer 28B, so that trenches 42A are formed in hard mask 28 and penetrate through metal hard mask layer 28B. The respective process is illustrated as process 210 in the process flow 200 as shown in FIG. 18. Trenches 42A may be stopped on hard mask layer 28A, and hard mask layer 28A is used as the etch stop layer. Hard mask layer 28C and metal hard mask layer 28B may be etched using different etching chemicals, and each may be etched using an anisotropic etching process (a dry etching process) or an isotropic etching process. For example, hard mask layer 28C may be etched using the mixture of $NF_3$ and $NH_3$ gases or the mixture of HF and $NH_3$ gases when dry etching is used, or HF solution when wet etching is used. Metal hard mask layer 28B may be etched using gases comprising $BCl_3$, $Cl_2$, $CF_4$, $CHF_3$, $NF_3$, $O_2$, Ar, etc. or combinations thereof when dry etching is used, or phosphoric acid solution when wet etching is used. Next, the remaining portions of etching mask 38 are removed, and the resulting structure is shown in FIG. 5. The respective process is illustrated as process 212 in the process flow 200 as shown in FIG. 18. The top view of the example trenches 42A may be found in FIG. 6B.

Figure 6A:
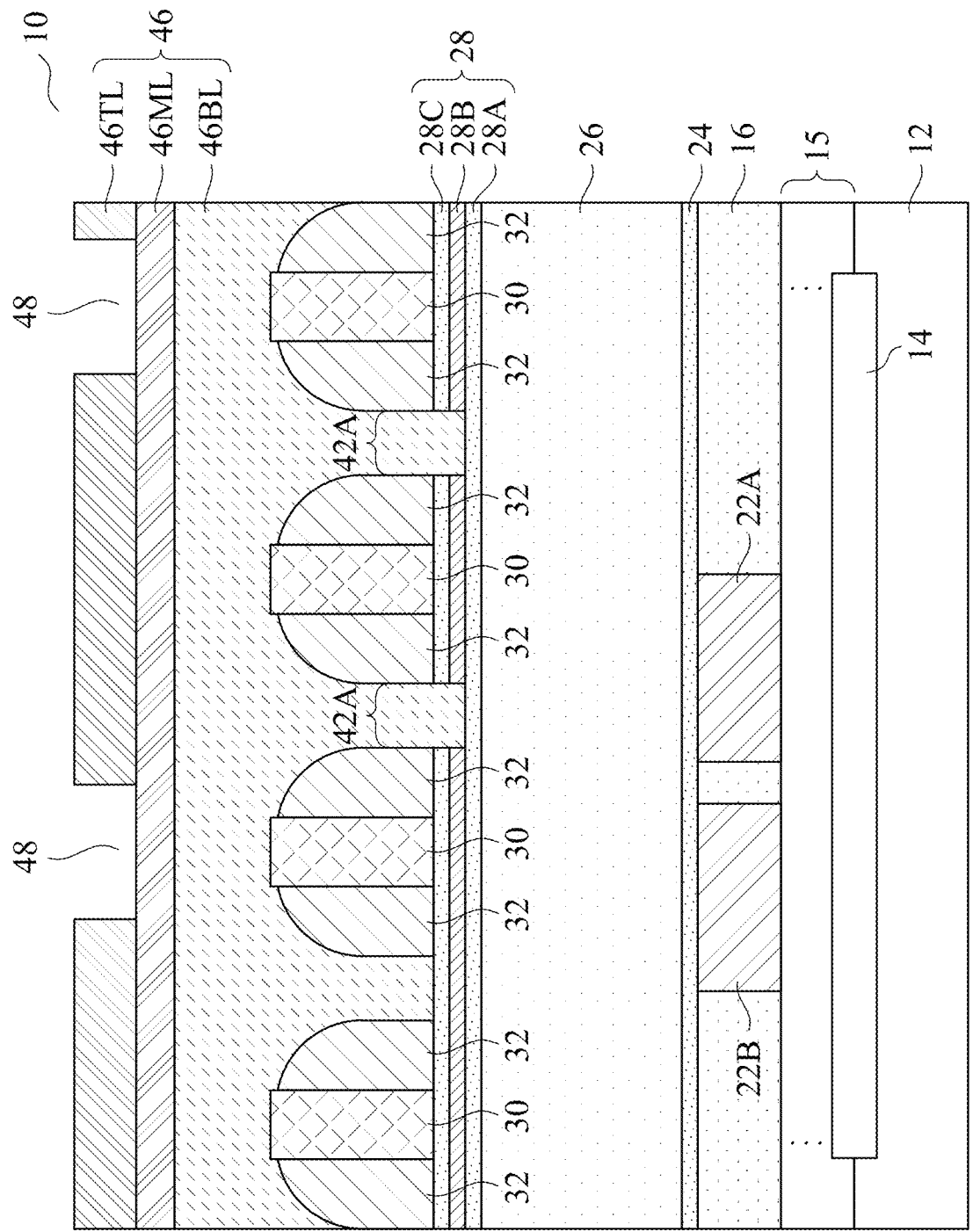
Figure 6B:
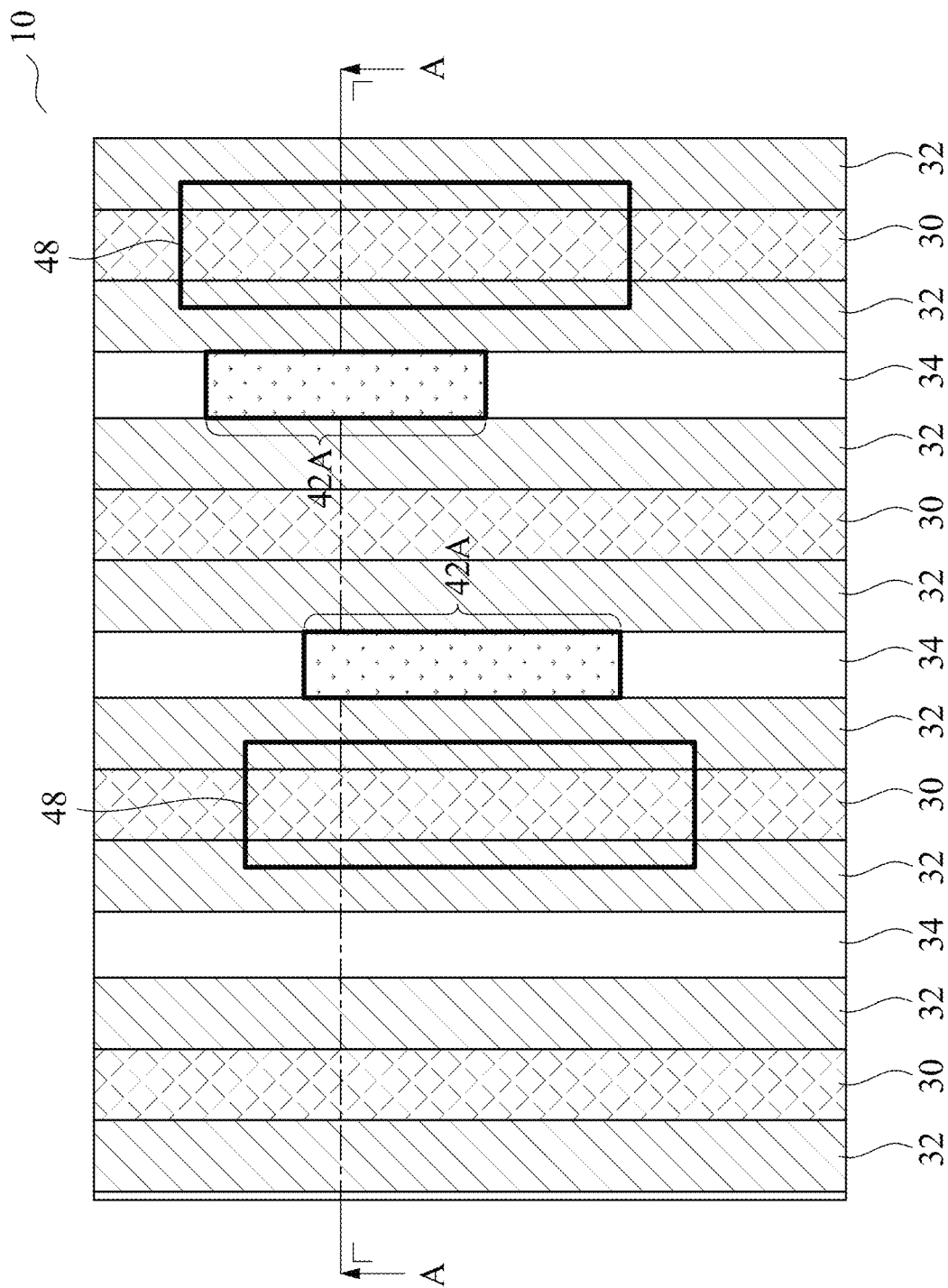
Figure 7:
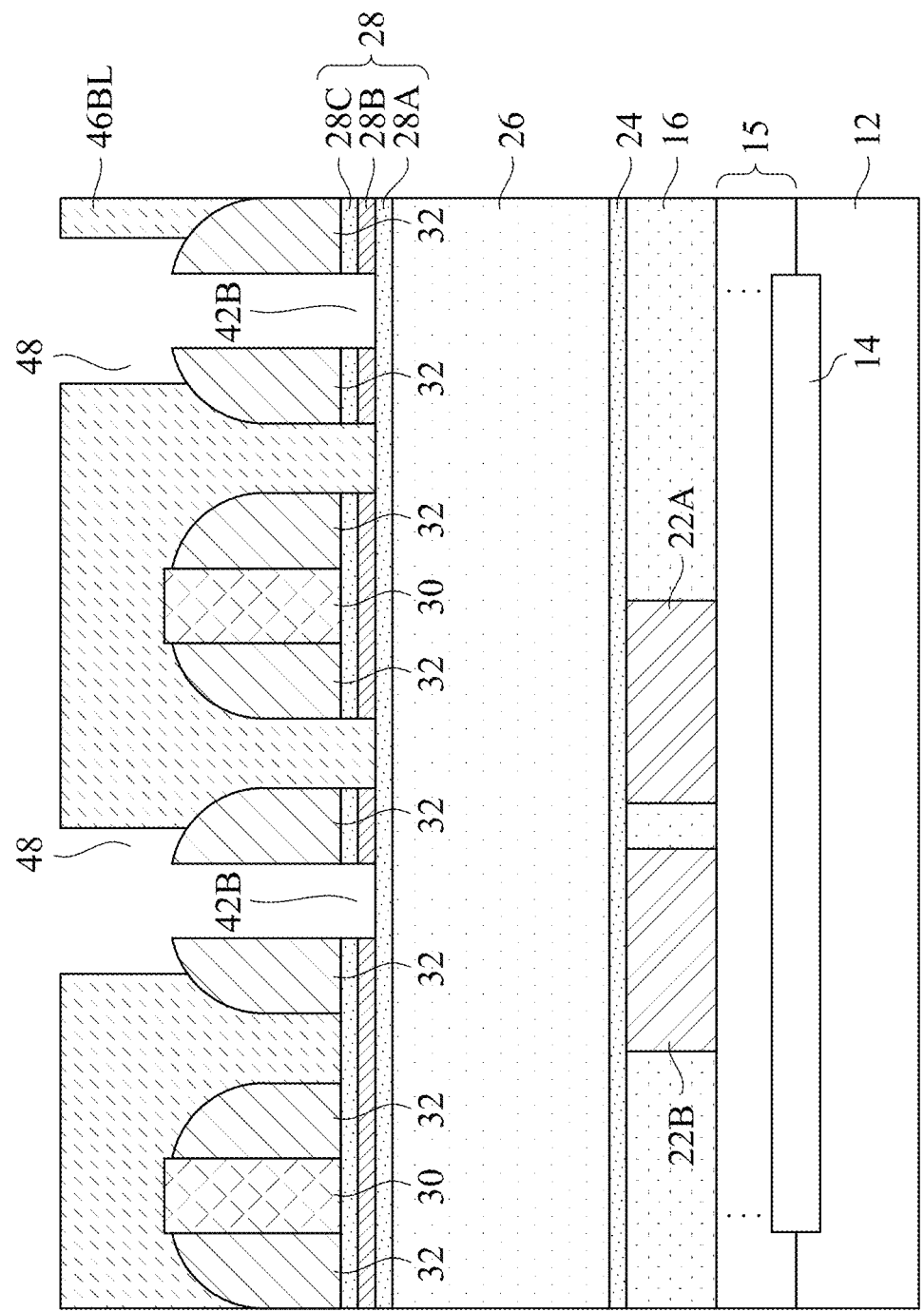

FIGS. 6A, 6B, and 7 illustrate the formation of second trench patterns in metal hard mask layer 28B in accordance with some embodiments. The respective processes may also be referred to as a second patterning process in a double-patterning process. Referring to FIG. 6A, an etching mask 46, which may be a tri-layer, is formed. The tri-layer includes bottom layer 46BL, middle layer 46ML over bottom layer 46BL, and top layer 46TL over middle layer 46ML. The respective process is illustrated as process 214 in the process flow 200 as shown in FIG. 18. The materials of bottom layer 46BL, middle layer 46ML, and top layer 46TL may be similar to the materials of bottom layer 38BL, middle layer 38ML, and top layer 38TL, respectively. Top layer 46TL is patterned to form openings 48, which are used to define trenches in low-k dielectric layer 26. The lithography process in the patterning of top layer 46TL may be performed using an EUV light, for example, with 193 nm wavelength.

FIG. 6B illustrates a top view of the structure shown in FIG. 6A. The previously formed trenches 42A are also illustrated as an example. The cross-sectional view shown in FIG. 6A is obtained from the reference cross-section A-A in FIG. 6B. Etching mask 46 is formed throughout the illustrated region in wafer 10, with openings 48 formed in etching mask 46. Openings 48 overlap some portions of mandrels 30.

Next, the middle layer 46ML (FIG. 6A) is etched using the patterned top layer 46TL as an etching mask, so that the opening 48 extends into middle layer 46ML. After middle layer 46ML is etched-through, bottom layer 46BL is patterned, during which middle layer 46ML is used as an etching mask. During the patterning of bottom layer 46BL, top layer 46TL is consumed. Middle layer 46ML may be partially or fully consumed during the patterning of bottom layer 46BL. In the patterning of bottom layer 46BL, openings 48 extend downwardly, revealing mandrels 30 and spacers 32.

Figure 8:
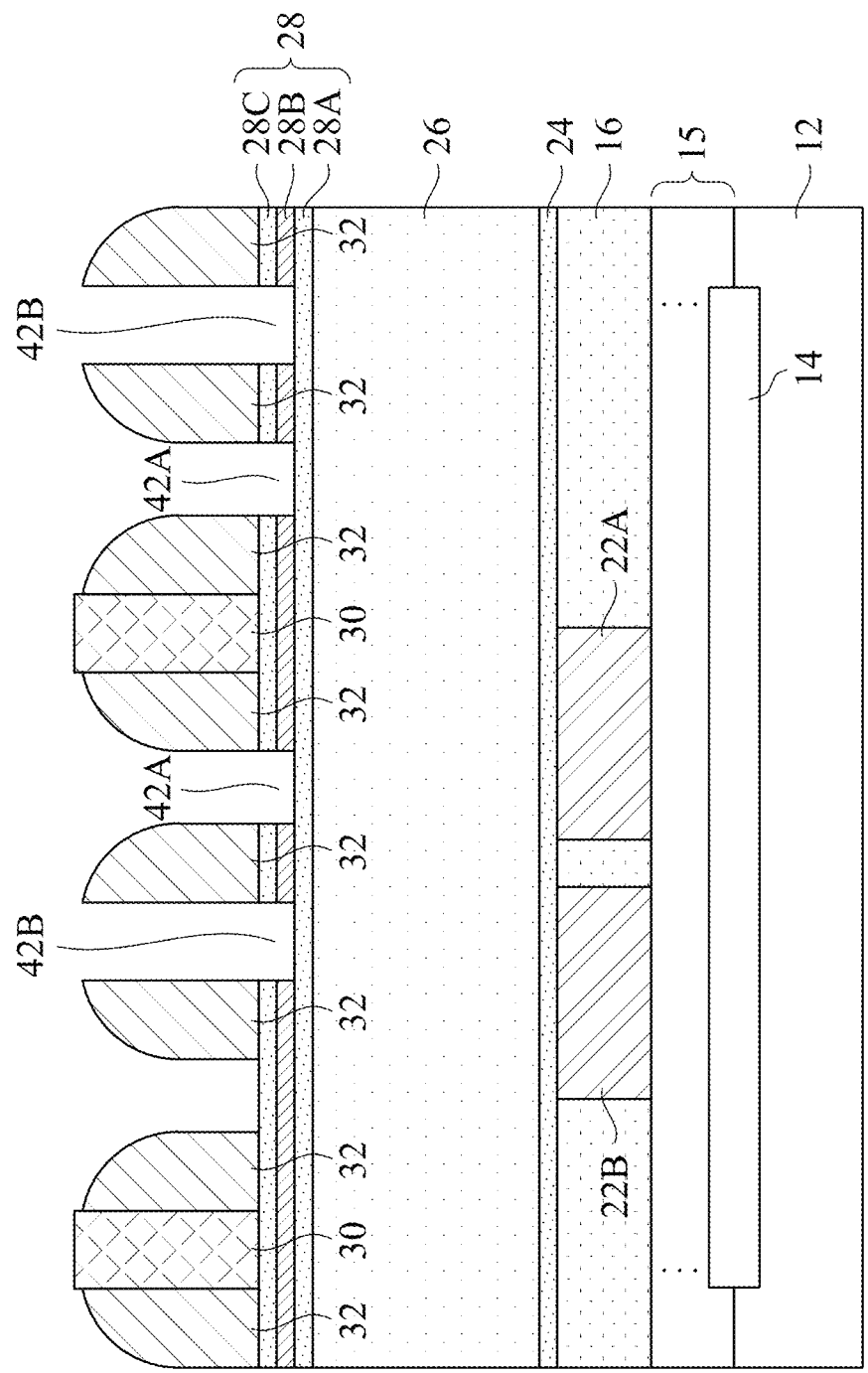

Next, an etching process is performed to remove the exposed mandrels 30, while spacers 32 are not removed. Trenches 42B are thus formed, as also shown in FIG. 7. The etching is performed using a process gas that attacks mandrels 30, and does not attack spacers 32. Hard mask layer 28C is used as the etch stop layer, and is exposed to trenches 42B. Next, hard mask layer 28C and metal hard mask layer 28B are etched, so that trenches 42B extend into hard mask layer 28C and metal hard mask layer 28B. The respective process is illustrated as process 216 in the process flow 200 as shown in FIG. 18. The etching process may be performed using the chemicals selected from the candidate etching chemicals for forming trenches 42A, and the details are not repeated herein. After metal hard mask layer 28B is etched-through, hard mask layer 28A are exposed, which acts as an etch stop layer for stopping the etching of metal hard mask layer 28B. Next, the remaining portions of etching mask 46 are removed, and the resulting structure is shown in FIG. 8. The respective process is illustrated as process 218 in the process flow 200 as shown in FIG. 18. The top view of the example trenches 42B may be found in FIG. 9C.

Figure 9A:
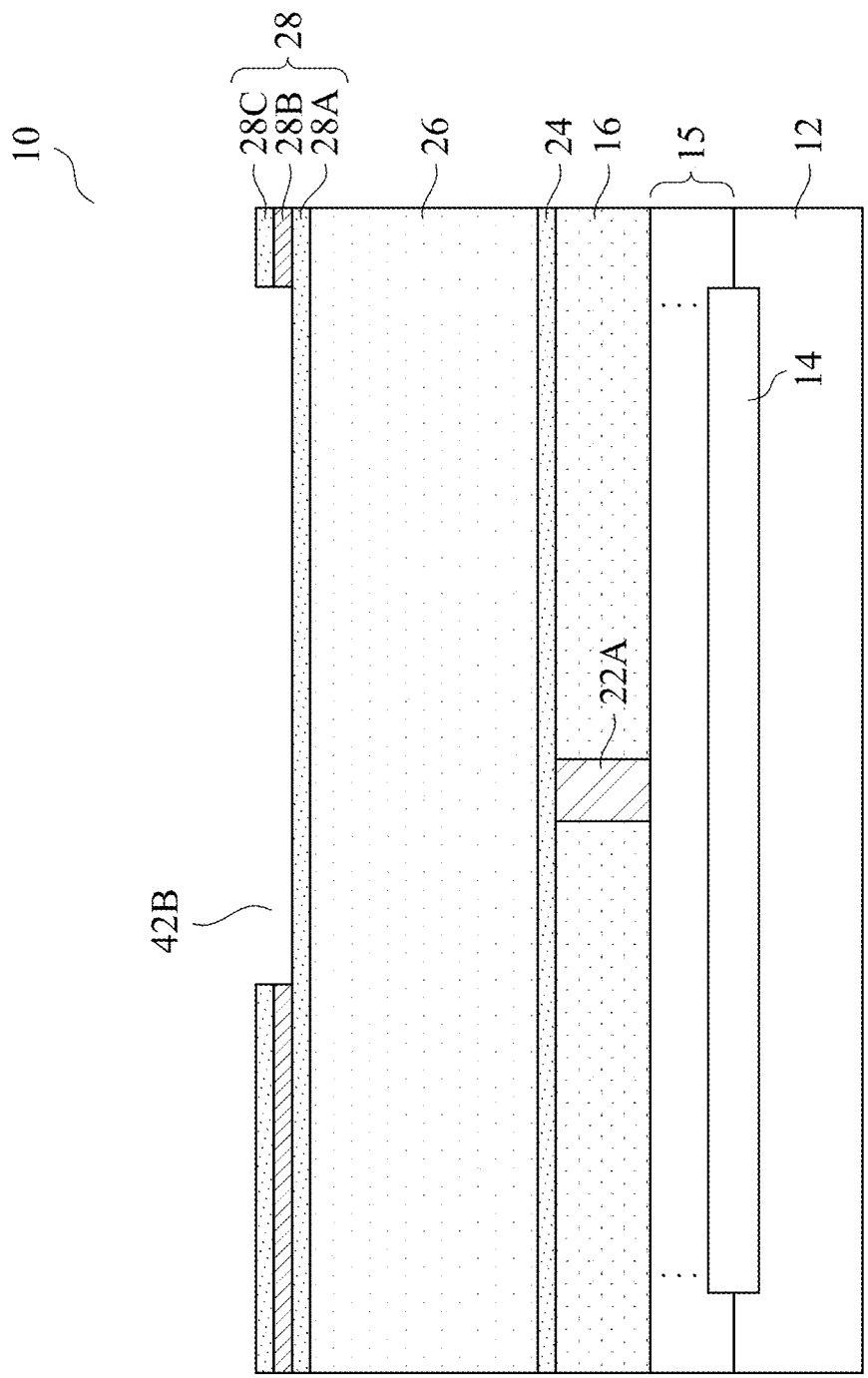
Figure 9B:
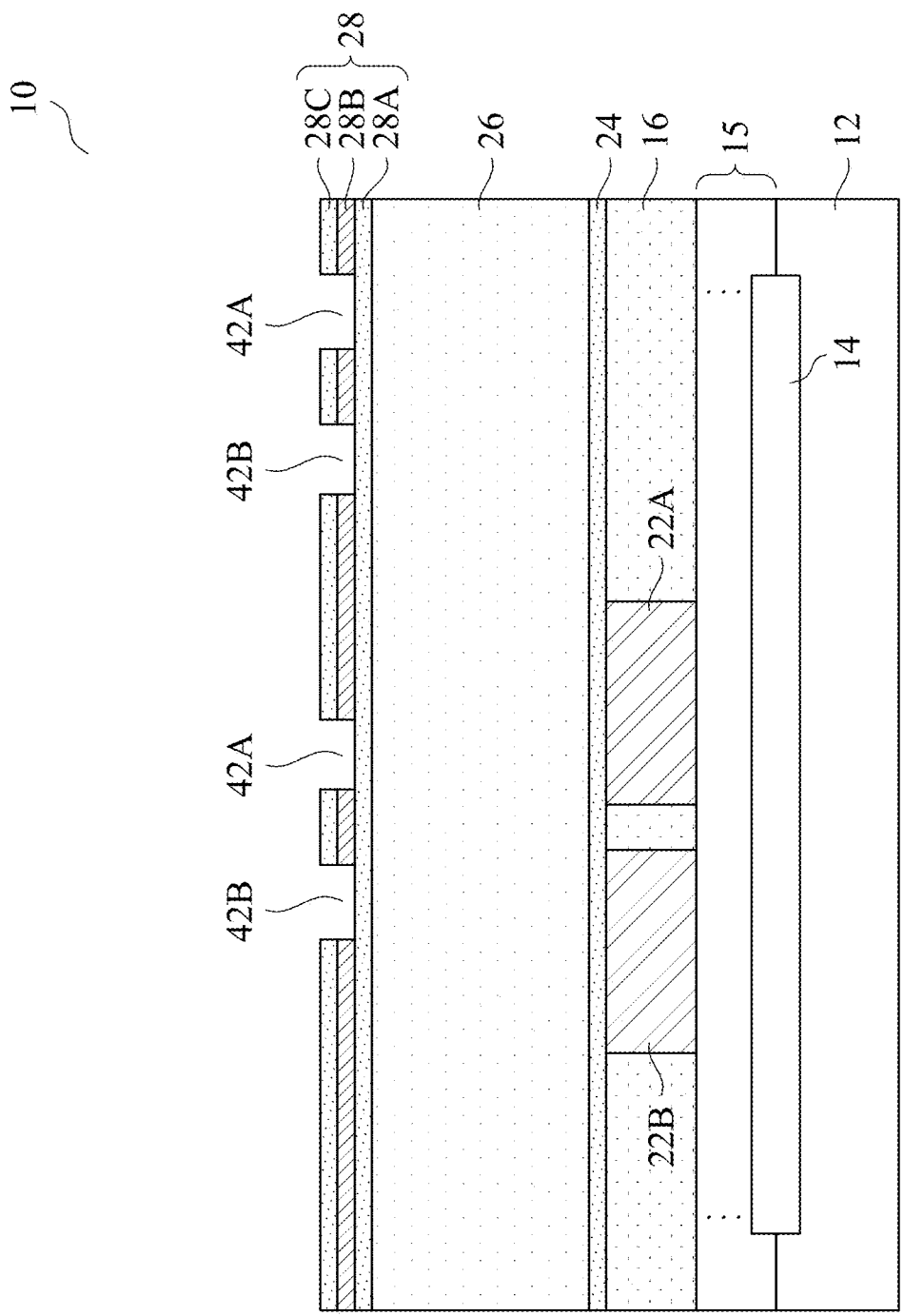
Figure 13:
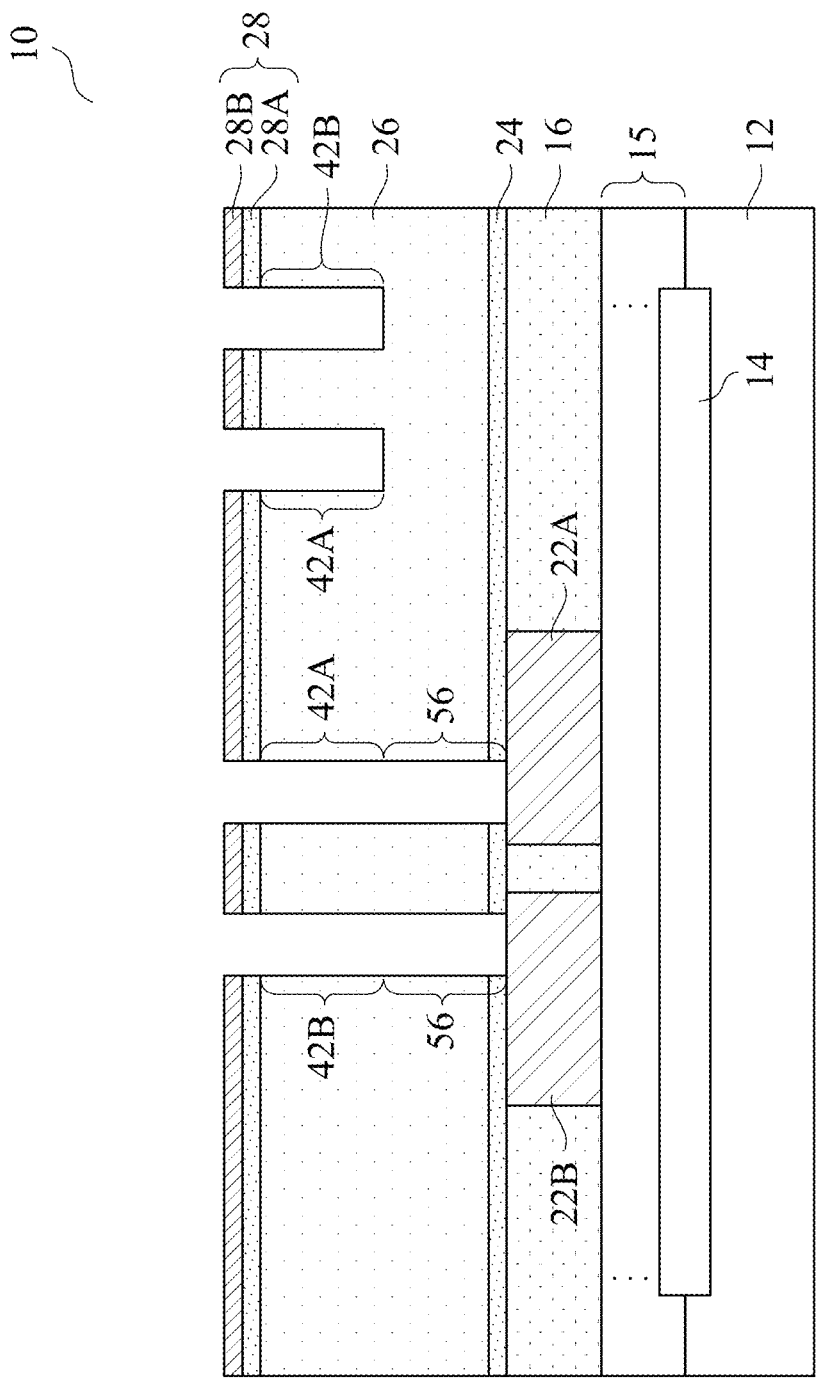
Figure 14:
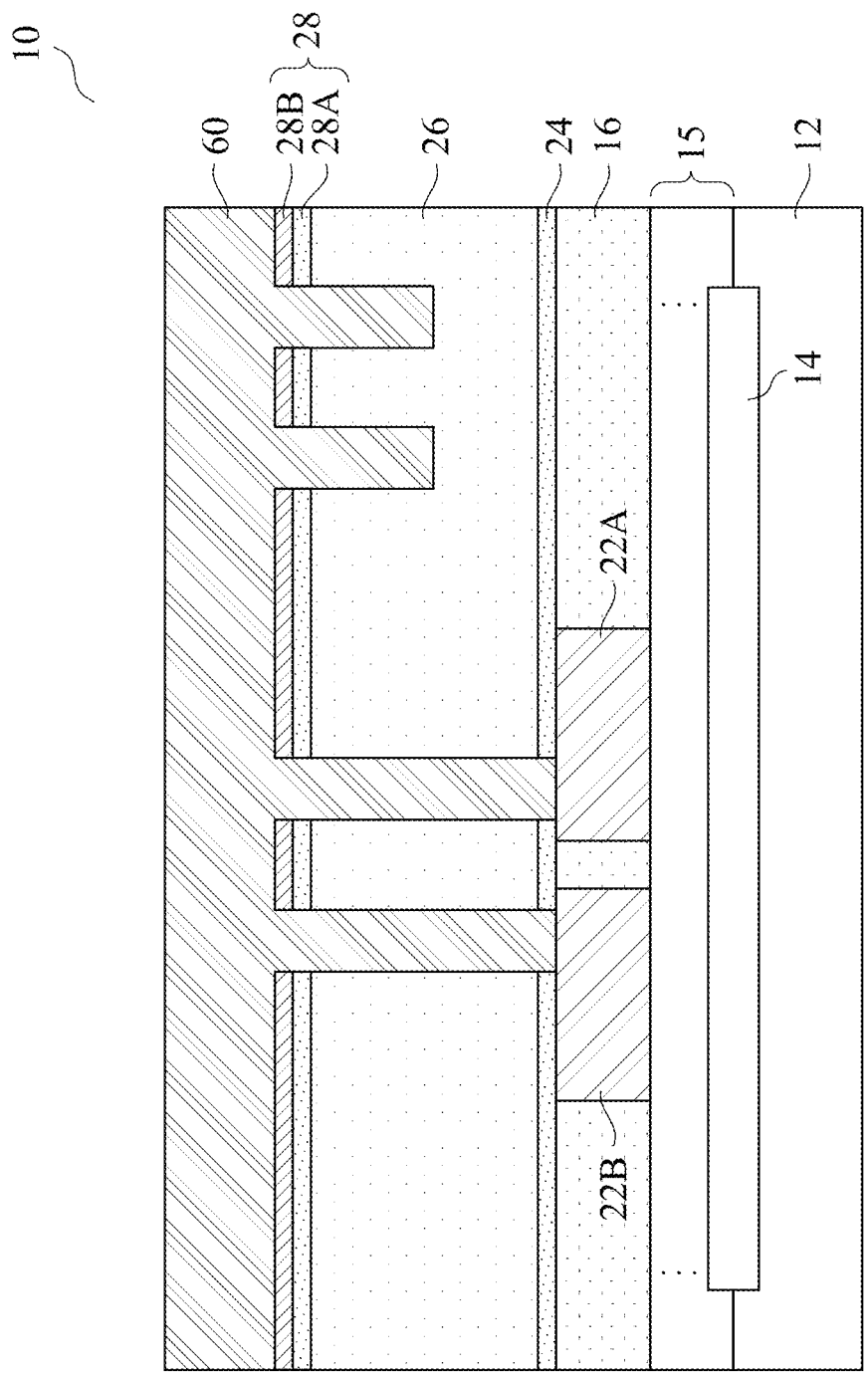
Figure 15A:
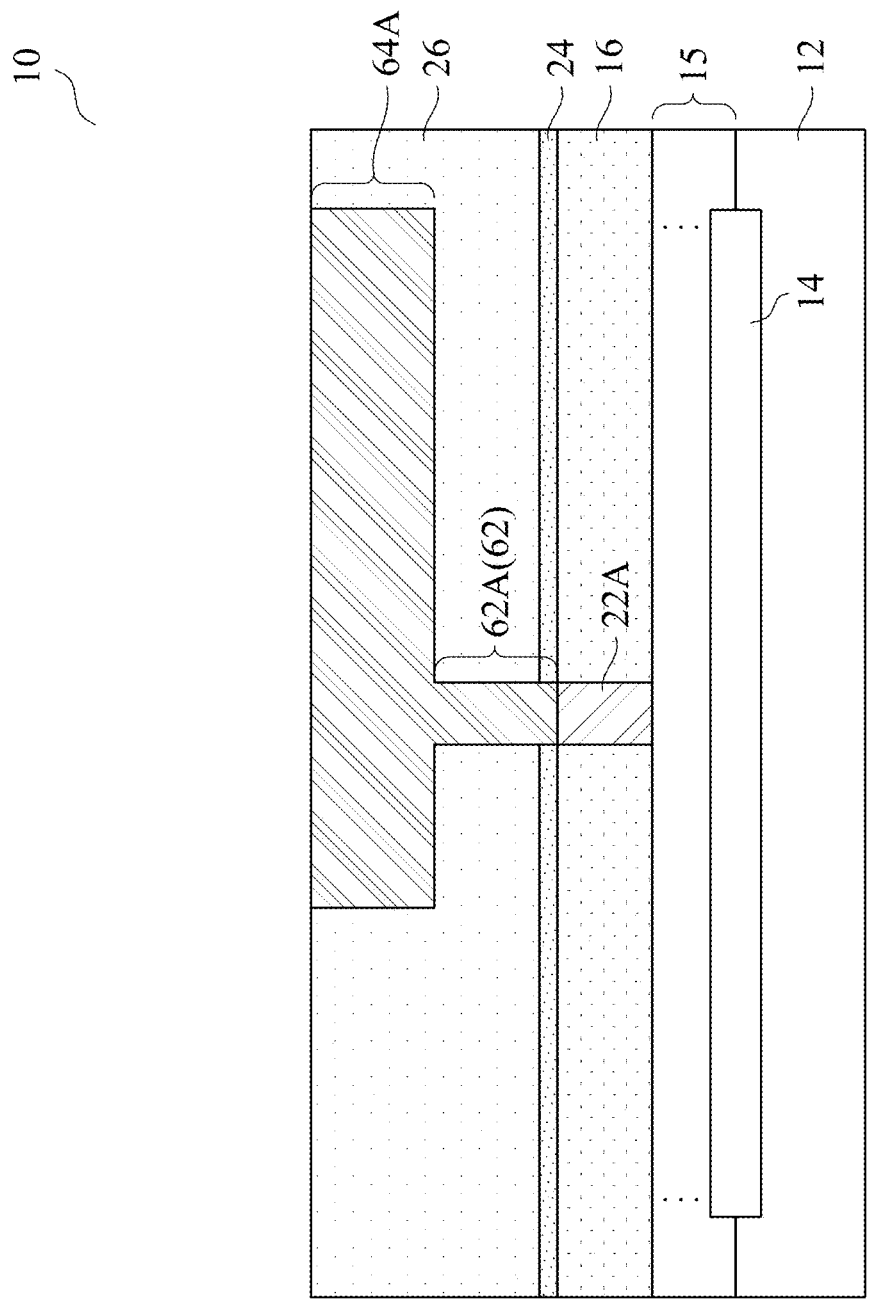

In a subsequent process, mandrels 30 and spacers 32 are removed, for example, in wet etching processes. The resulting structure is shown in FIG. 9B (and also in FIGS. 9A and 9C). The respective process is illustrated as process 220 in the process flow 200 as shown in FIG. 18. In accordance with Alternative embodiments, mandrels 30 and spacers 32 are not removed at this stage, and may be removed after the subsequent formation of via openings. For example, instead of removing mandrels 30 and spacers 32 in the step shown in FIGS. 9A and 9B, mandrels 30 and spacers 32 may be removed between the steps shown in FIGS. 13 and 14, which is after the formation of trenches and via openings (FIG. 13), and before the deposition of conductive material into trenches and via openings. In accordance with yet alternative embodiments, mandrels 30 and spacers 32 may be removed after the deposition of conductive material 60 as shown in FIG. 14, and may be removed in the same planarization process for removing excess conductive materials 60, as shown in FIGS. 14 and 15A.

Figure 9C:
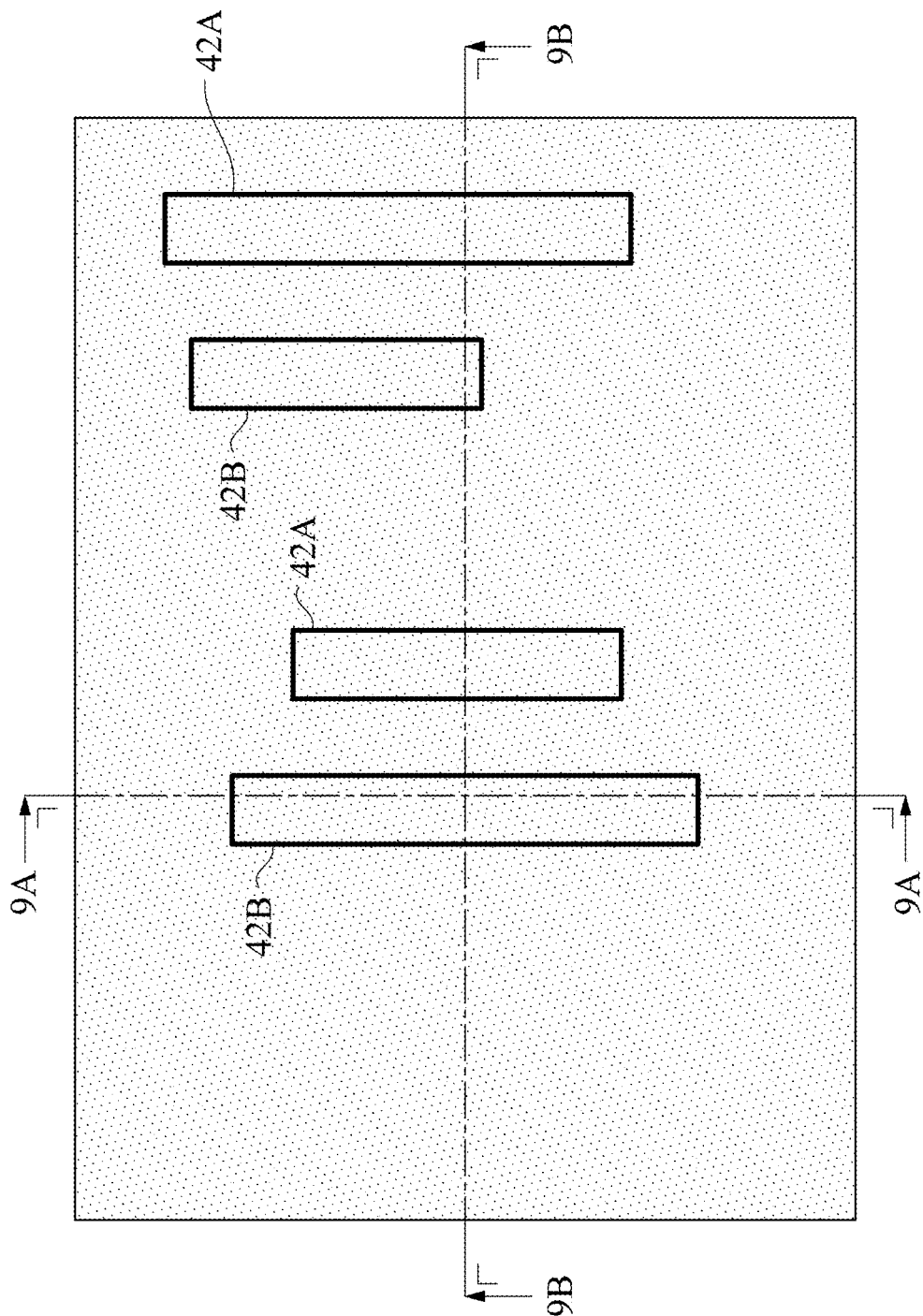

Referring again to FIGS. 9A and 9B, after the removal of mandrels 30 and spacers 32, hard mask layer 28C is exposed. FIG. 9B illustrates the structure corresponding to FIG. 8. FIG. 9C illustrates a top view of the structure shown in FIGS. 9A and 9B, with FIGS. 9A and 9B illustrate the reference cross-section 9A-9A and 9B-9B, respectively in FIG. 9C. It is shown that trenches 42A and 42B are formed as elongated strips that are parallel to, and are close to, each other.

Figure 10A:
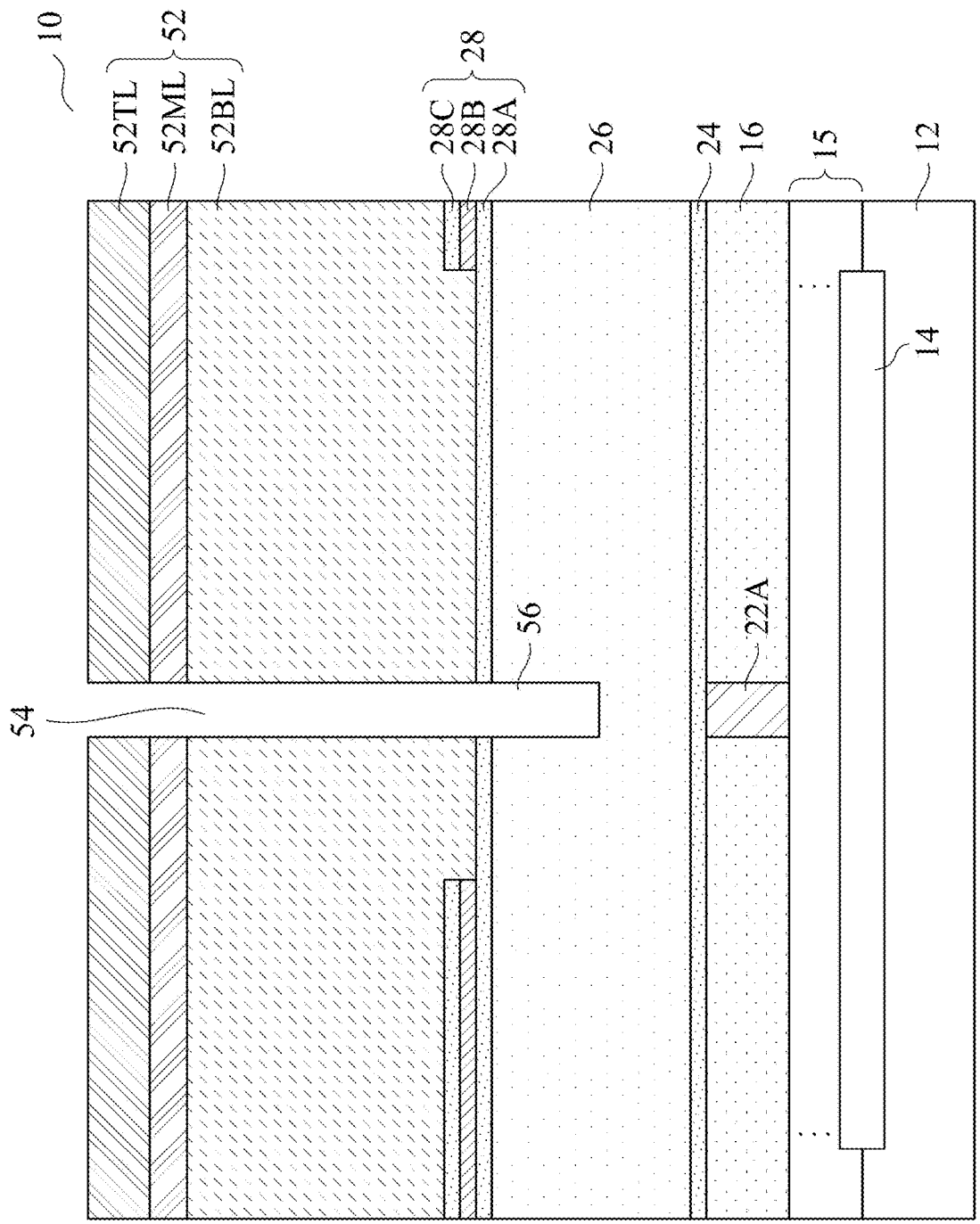
Figure 10B:
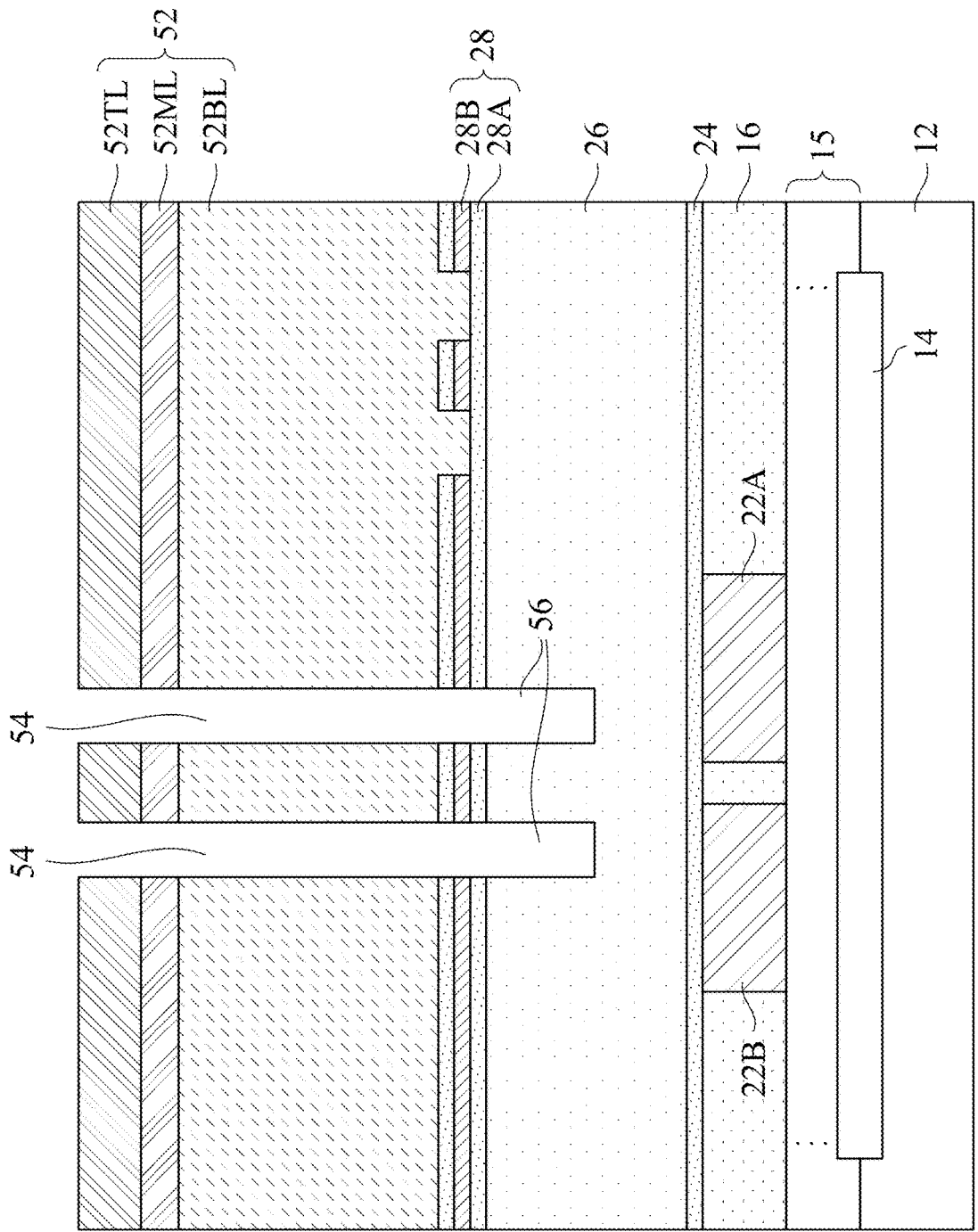
Figure 10C:
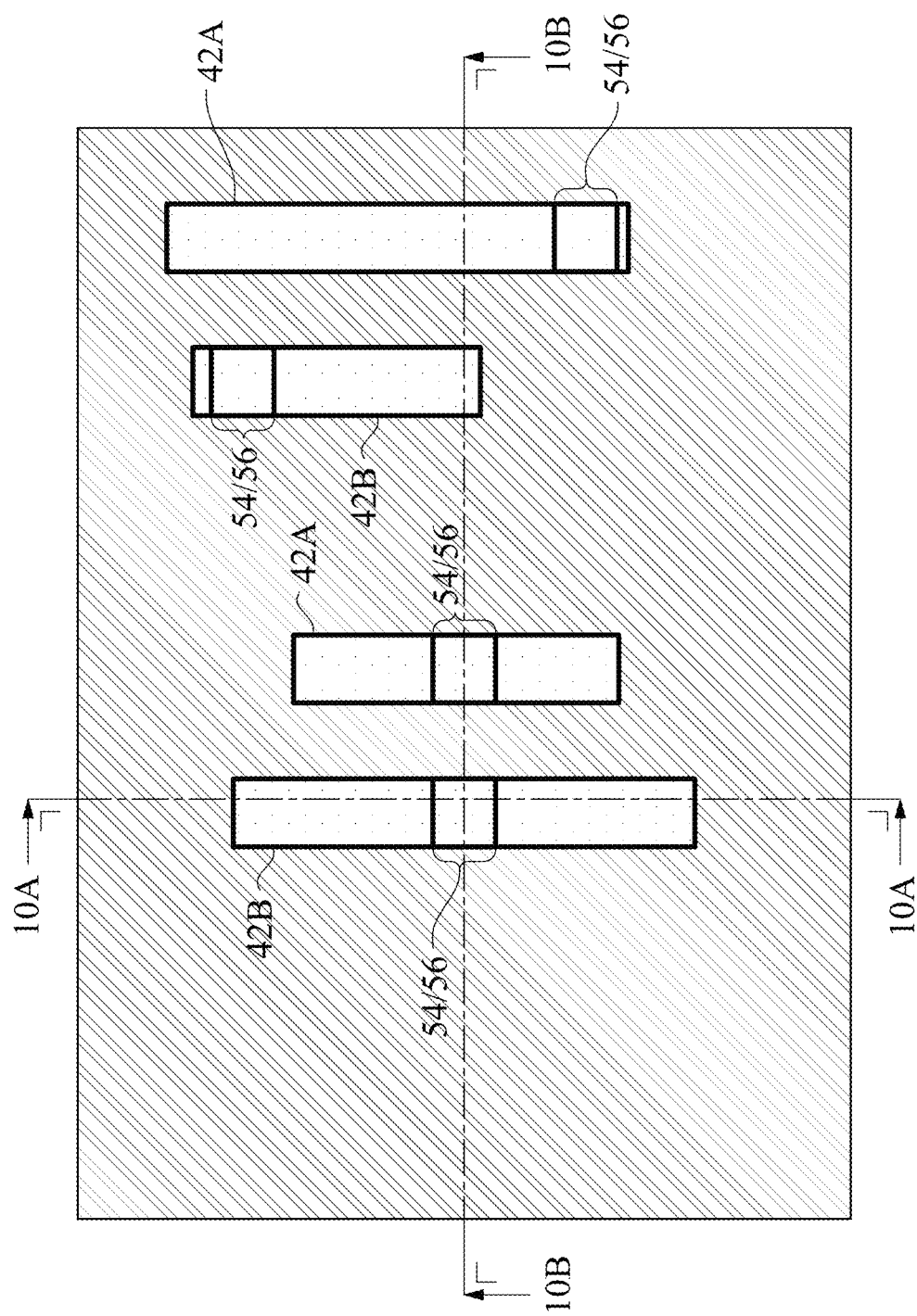

FIGS. 10A, 10B, and 10C illustrate the cross-sectional views and the top view of the formation of via openings 56. FIG. 10C illustrates a top view of the structure shown in FIGS. 10A and 10B, with FIGS. 10A and 10B illustrating the reference cross-sections 10A-10A and 10B-10B, respectively, in FIG. 10C.

Referring to FIGS. 10A and 10B, etching mask 52, which may be a tri-layer, is formed. The respective process is illustrated as process 224 in the process flow 200 as shown in FIG. 18. The tri-layer includes bottom layer 52BL, middle layer 52ML over bottom layer 52BL, and top layer 52TL over middle layer 52ML. The materials of bottom layer 52BL, middle layer 52ML, and top layer 52TL may be similar to the materials of bottom layer 38BL, middle layer 38ML, and top layer 38TL, respectively. Top layer 52TL is patterned to form opening(s) 54 (also refer to FIG. 10C), which is used to define via openings in low-k dielectric layer 26. Accordingly, openings 54 may overlap some parts of trenches 42A and 42B, as shown in FIG. 10C.

In the formation of openings 54, the middle layer 52ML (FIGS. 10A and 10B) is etched first using the patterned top layer 52TL as an etching mask, so that the openings 54 extend into middle layer 52ML. After middle layer 52ML is etched-through, bottom layer 52BL is patterned, during which middle layer 52ML is used as an etching mask. During the patterning of bottom layer 52BL, top layer 52TL is consumed. Middle layer 52ML may be partially or fully consumed during the patterning of bottom layer 52BL. In the patterning of bottom layer 52BL, openings 54 extend down, revealing the underlying hard mask layer 28A.

The etching is continued to etch hard mask layer 28A. Next, dielectric layer 26 is etched, so that via openings 56 are formed in dielectric layer 26. The respective process is illustrated as process 226 in the process flow 200 as shown in FIG. 18. In accordance with some embodiments, the etching of dielectric layer 26 is performed using an etching gas selected from $C_4F_6$, $C_4F_8$, $C_5F_8$, $CF_4$, $CHF_3$, $CH_2F_2$, $NF_3$, $N_2$, $O_2$, Ar, He, and combinations thereof. The etching is stopped at an intermediate level between the top surface and the bottom surface of dielectric layer 26.

In the above-discussed example via formation process, a single-patterning process is used. Via openings 56 may also be formed using double-patterning processes in accordance with alternative embodiments.

Figure 11A:
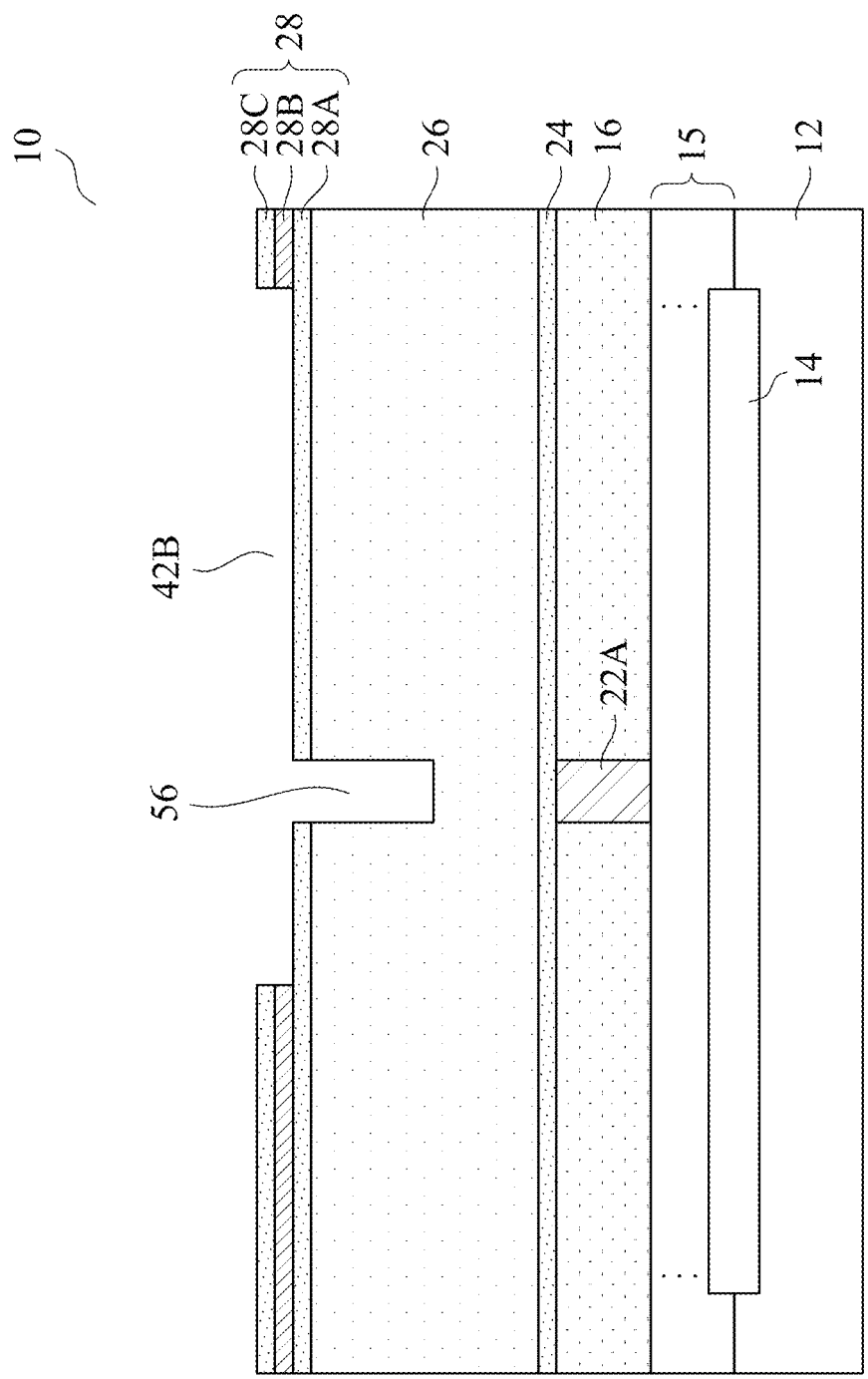
Figure 11B:
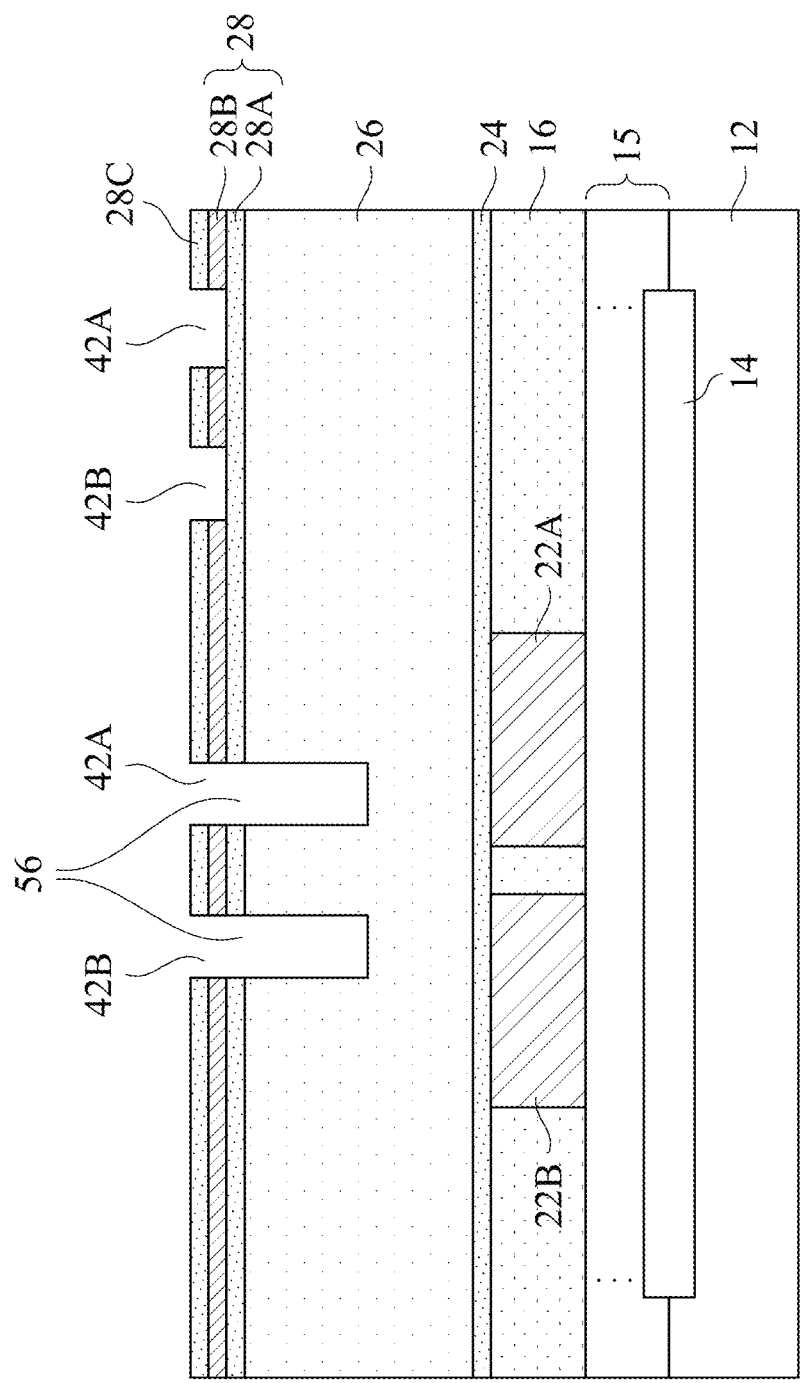

FIG. 10C illustrates a top view of the structure shown in FIGS. 10A and 10B. As shown in FIG. 10C, openings 54 cross over the previously formed trenches 42A and 42B. Via openings 56 are also shown in FIG. 10C. Etching mask 52 is then removed, and the resulting structure is shown in FIGS. 11A and 11B. The respective process is illustrated as process 228 in the process flow 200 as shown in FIG. 18.

Figure 12A:
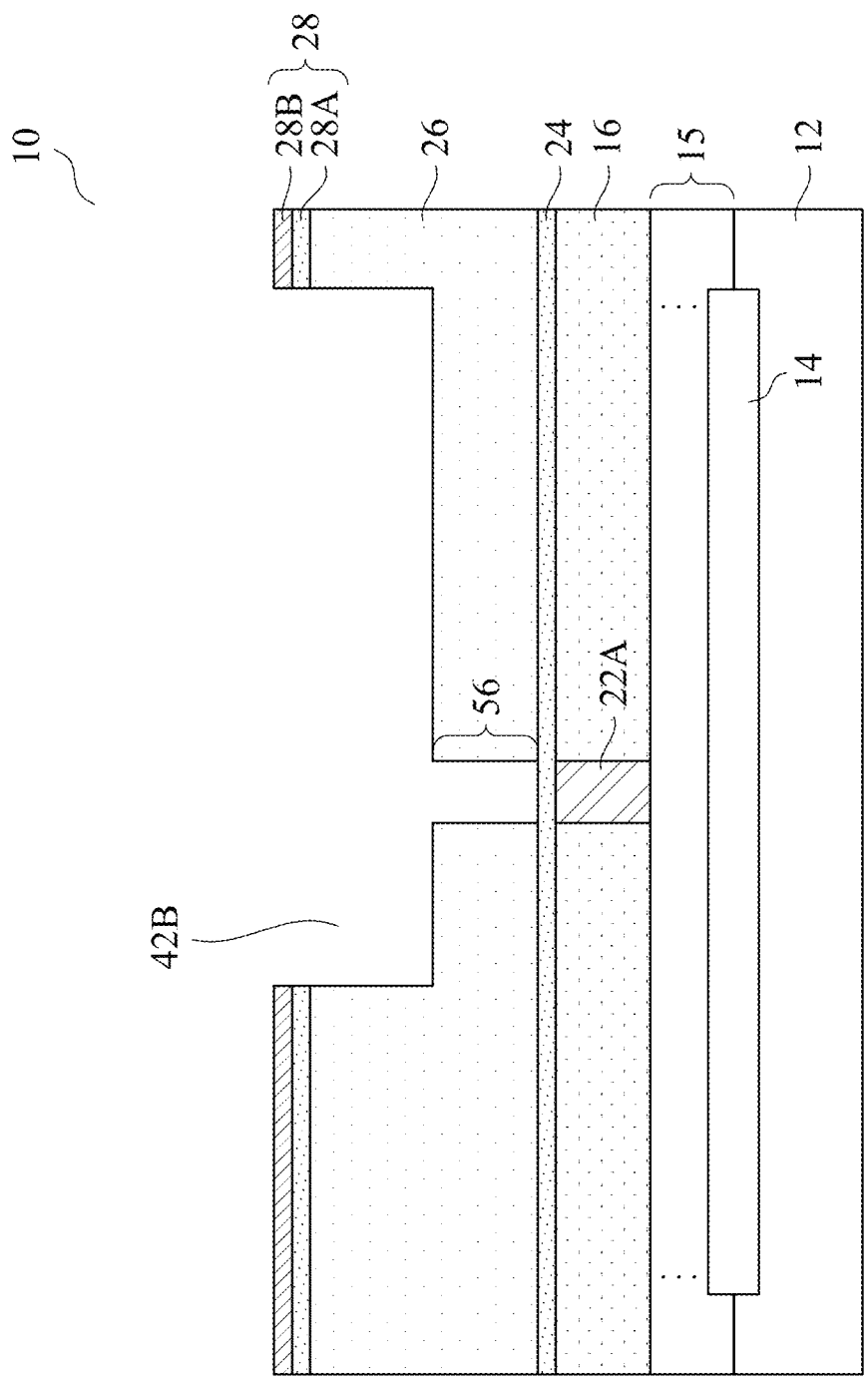
Figure 12B:
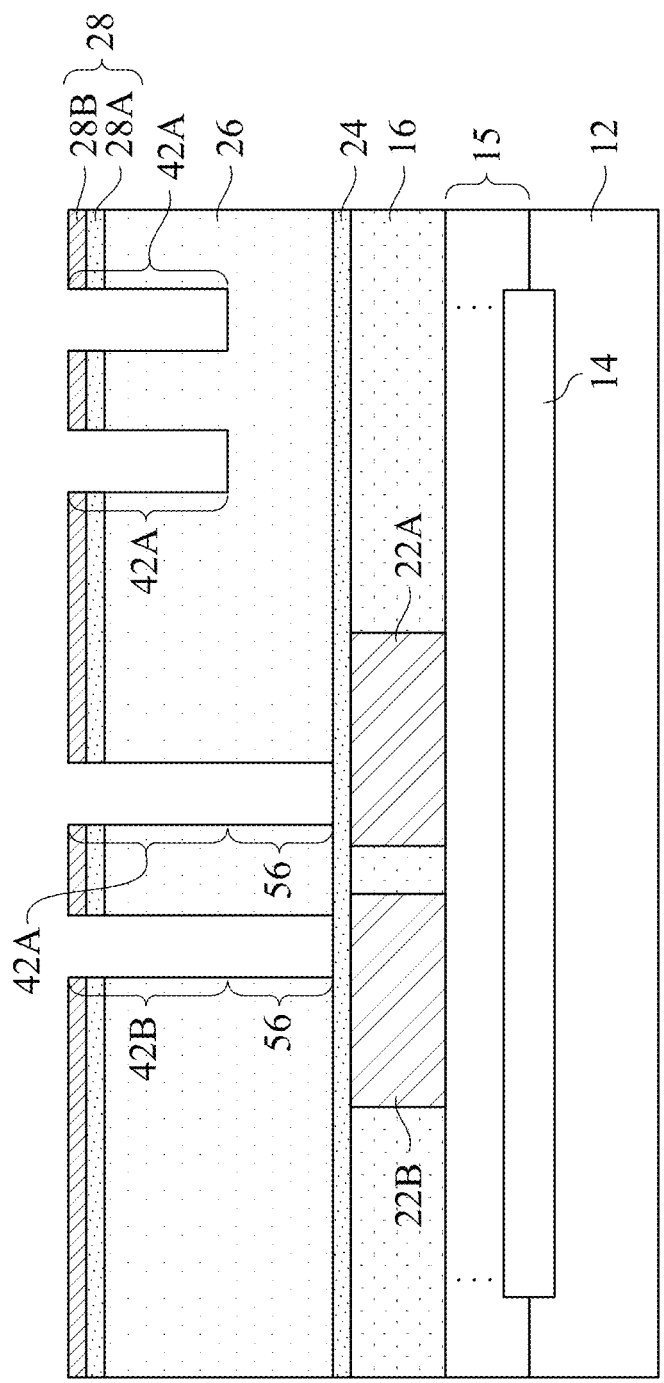

In a subsequent process, as shown in FIGS. 12A and 12B, hard mask layer 28A is etched-through, exposing the underlying dielectric layer 26. Next, dielectric layer 26 is etched, so that trenches 42A and 42B extend into low-k dielectric layer 26. In the meanwhile, via openings 56 extend down to the bottom of dielectric layer 26. The respective process is illustrated as process 230 in the process flow 200 as shown in FIG. 18. In accordance with some embodiments, the etching of dielectric layer 26 is performed using an etching gas selected from $C_4F_6$, $C_4F_8$, $C_5F_8$, $CF_4$, $CHF_3$, $CH_2F_2$, $NF_3$, $N_2$, $O_2$, Ar, He, and combinations thereof. In accordance with some embodiments, trenches 42A and 42B extend to an intermediate level between the top surface and the bottom surface of dielectric layer 26, and the intermediate level may be in the middle between the top surface and the bottom surface of dielectric layer 26. In accordance with some embodiments, hard mask layer 28C is consumed during the etching of hard mask layer 28A, and during the subsequent etching processes.

Metal hard mask layer 28B, due to its high modulus and high tensile stress, has the advantageous feature of improving the profile of the underlying trenches 42A and 42B. For example, the roughness of the sidewalls of dielectric layer 26, which sidewalls are exposed to trenches 42, is reduced. Also, when viewed from top (FIG. 10C), trenches 42A and 42B are straighter, and the sidewalls of dielectric layer 26 facing trenches 42A and 42B are smoother. Accordingly, in the top view, the trench width roughness is reduced. Experiment results have revealed that the line-width roughness (viewed in FIG. 10C) of trenches 42A and 42B is smaller than about 2.0, for example, when the pitches of trenches 42 are smaller than 20 nm.

Next, an etching process(es) is performed to etch-through etch stop layer 24 and to reveal conductive features 22A and 22B. The resulting structure is shown in FIG. 13.

FIG. 14 illustrates the deposition of conductive material 60 to fill trenches 42A and 42B and via openings 56. The respective process is illustrated as process 232 in the process flow 200 as shown in FIG. 18. In accordance with some embodiments, a metallic material such as cobalt, tungsten, or the like, or combinations thereof, is filled, which may be deposited using a barrier-less process, wherein no barrier is formed, and the metallic material is in physical contact with conductive feature 22A and dielectric layer 26. In accordance with alternative embodiments, the conductive material may include a barrier and a metallic material on the diffusion barrier. The barrier may be formed of titanium, titanium nitride, tantalum, tantalum nitride, or the like. The metallic material may be formed of or comprise copper.

Figure 15B:
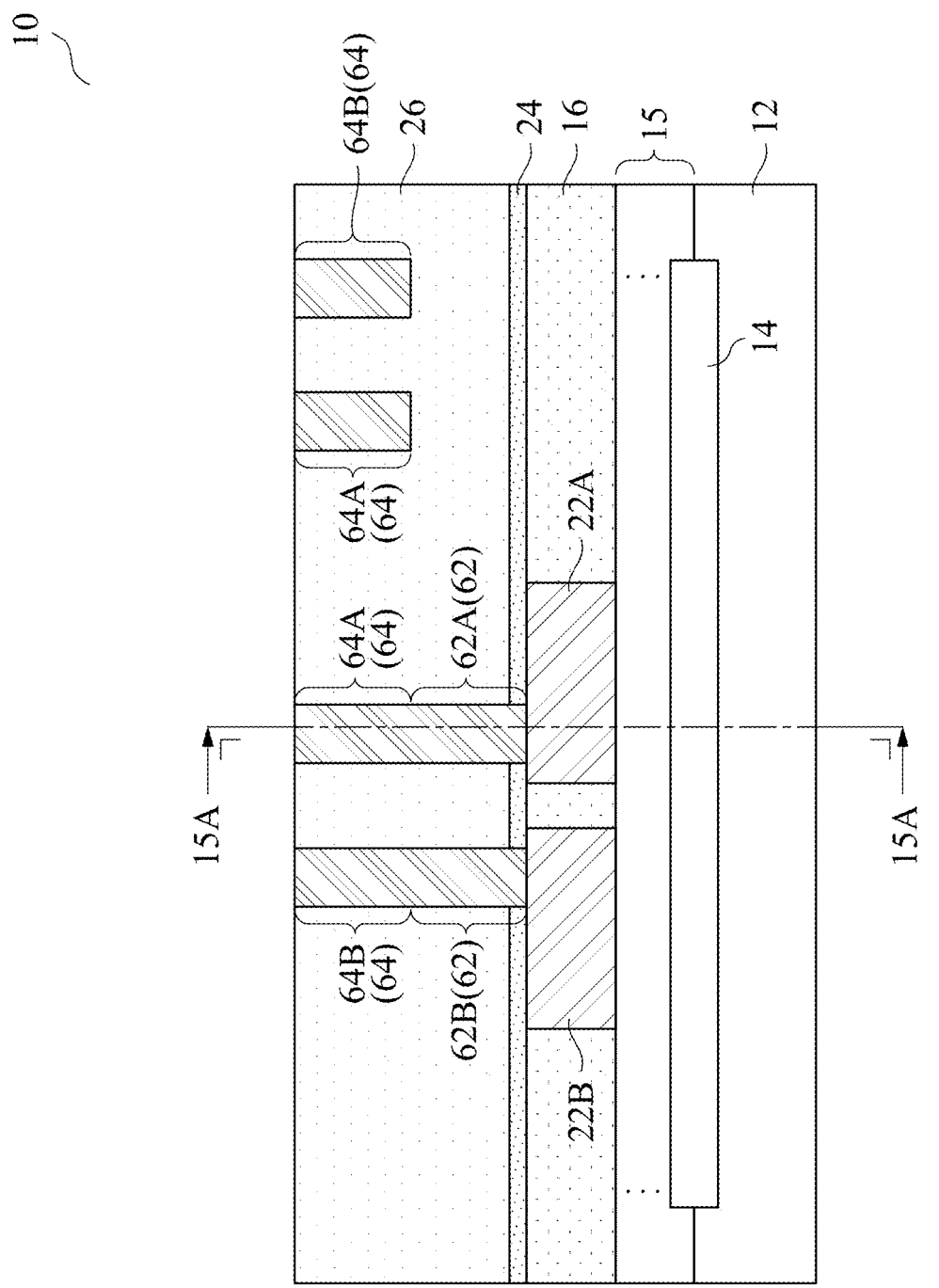

In a subsequent process, as shown in FIGS. 15A and 15B, a planarization process such as a Chemical Mechanical Polish (CMP) process or a mechanical polishing process is performed to remove excess portions of conductive material 60. The respective process is illustrated as process 234 in the process flow 200 as shown in FIG. 18. In accordance with some embodiments, dielectric layer 26 is used as a CMP stop layer. In accordance with alternative embodiments, hard mask layer 28A or 28B is used as a CMP stop layer, and metal hard mask layer 28B (and optionally hard mask layer 28A) is etched in a subsequent process. Vias 62A and 62B (individually and collectively referred to as vias 62) and metal lines 64A and 64B (individually and collectively referred to as metal lines 64) are formed. FIG. 15A illustrates the reference cross-section 15A-15A in FIG. 15B.

It is appreciated that although in the embodiments as discussed, a dual damascene process is illustrated as an example to form both of metal lines 64 and vias 62, the processes in the present disclosure may also be used for forming single damascene structures.

Figure 16:
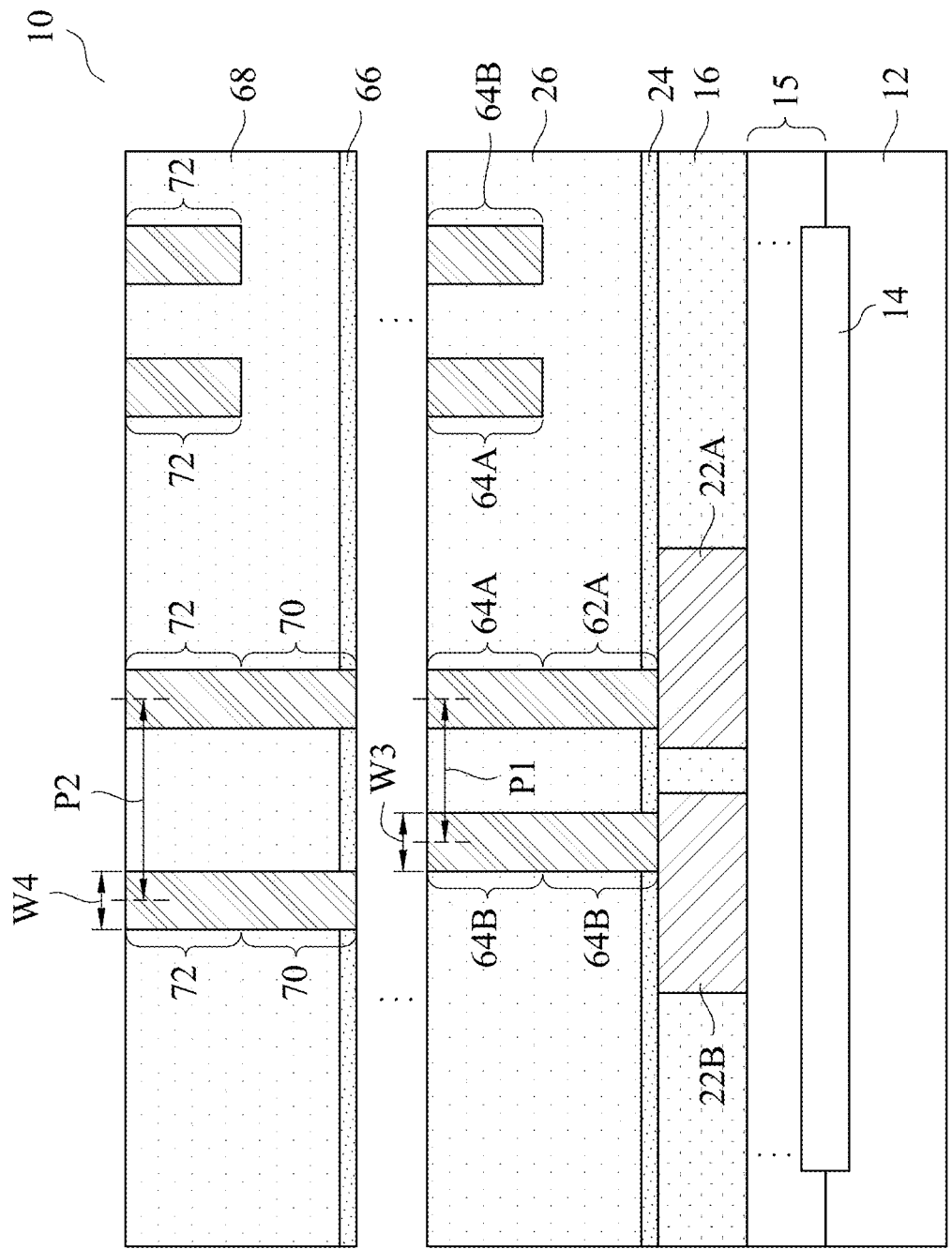

FIG. 16 illustrates the formation of an upper layer, which includes etch stop layer 66, dielectric layer 68, vias 70, and metal lines 72. The formation process may be similar to the formation of vias 62 and metal lines 64, except the formation of the metal hard mask layer 28B for forming vias 62 and metal lines 64 may be different from the formation of the metal hard mask layer (which corresponds to metal hard mask layer 28B) for forming vias 70, and metal lines 72. The rest of the materials and the formation processes for forming etch stop layer 66, dielectric layer 68, vias 70, and metal lines 72 may be similar to the corresponding etch stop layer 24, dielectric layer 26, vias 62, and metal lines 64, respectively.

In accordance with some embodiments, when the line widths and pitches of metal lines are small, for example, when the line widths are smaller than a threshold value (for example, a value in the range between about 20 nm and about 30 nm), the corresponding metal hard mask layer is formed to have a high Young's modulus and a high tensile stress (as discussed above), so that the line-width roughness of the corresponding metal lines/vias is reduced. On the other hand, when the line widths and pitches of metal lines are larger, for example, when the line widths are greater than the threshold value, the metal hard mask layer may be formed to have a lower Young's modulus and/or a lower tensile stress without the concern of having the line-width roughness being out of specification. In accordance with some embodiments, the lower metal layers (such as the layer of metal features 22A/22B and 64A/64B/56A/56B), which have denser metal lines, smaller line widths W3, and smaller pitches P1, are formed with the help of metal hard mask layers with high Young's modulus and high tensile stress, as discussed in previous embodiments. The upper layers (such as the metal layers of metal lines 72 and vias 70), which have looser metal lines, greater line widths W4, and greater pitches P2, are formed with the corresponding metal hard mask layers being formed of other materials (such as TiN) having low Young's modulus and/or low tensile stress. The processes and the structures involved in the formation of the upper metal layers are essentially the same as shown in preceding embodiments, except the corresponding metal hard mask layer 28B may be replaced with a metal hard mask layer with a lower Young's modulus and/or a lower tensile stress. For example, TiN may be used for forming the metal hard mask layer used for forming upper metal layers, with the TiN having Young's modulus of about 306 MPa and tensile stress of about 750 MPa. In accordance with some embodiments, the ratio P2/P1 is greater than 1.0, and may be greater than about 1.5 or greater than about 2.0. Ratio W4/W3 may also be greater than 1.0, and may be greater than about 1.5 or greater than about 2.0. Furthermore, in a wafer/device, there may be a dividing metal layer, and the dividing metal layer and all metal layers underlying (and including) the dividing metal layers may be formed using metal hard mask layers having high Young's modulus and high tensile stress, while all metal layers overlying the dividing metal layers (which have larger pitches and larger widths) may be formed using metal hard mask layers having low Young's modulus and/or low tensile stress.

The tensile stress of the metal hard mask layer 28B and its effect on the bending of metal lines have been studied by forming sample wafers, with the structures in FIGS. 15A and 15B being formed using the illustrated processes. In a first group of samples, the tensile stress values in the corresponding metal hard mask layers are relatively low and are in the range between about 500 MPa and about 1,000 MPa. In a second group of samples, the tensile stress values in the corresponding metal hard mask layers are medium and are in the range between about 1,000 MPa and about 1,300 MPa. In a third group of samples, the tensile stress values in the corresponding metal hard mask layers are relatively high and are in the range between about 1,300 MPa and about 2,000 MPa. The Transmission Electron Microscopy (TEM) results revealed that in the low-stress samples, the normalized bending of metal lines is 1.17, in the medium-stress samples, the normalized bending of metal lines is 1.20. This means that the low-stress samples and medium-stress samples are not significantly affected by the tensile stress therein. The normalized bending of metal lines in the high-stress samples, however, is significantly reduced to 0.67. This means that increasing the tensile stress to certain value may significantly reduce the metal line bending. It is also appreciated that the low-stress ranges, medium-stress ranges, and high-stress ranges are related to various factors, and may shift when structures and materials are changed. For example, in some embodiments, the tensile stress greater than about 600 MPa may be considered as being high-stress.

The embodiments of the present disclosure have some advantageous features. By forming high-stress and high-modulus metal hard mask layers, which are used for patterning the underlying dielectric layers to form trenches and via openings, the resulting metal lines and vias have smaller line-width roughness and line edge roughness. The breaking of the lines is thus reduced. It is also easier for performing the gap-filling process when the trenches and via openings are filled.

In accordance with some embodiments of the present disclosure, a method comprises forming a metal-containing hard mask layer over a dielectric layer, wherein the metal-containing hard mask layer has a Young's modulus greater than about 400 MPa, and a tensile stress greater than about 600 MPa; patterning the metal-containing hard mask layer to form a first opening in the metal-containing hard mask layer; etching the dielectric layer using the metal-containing hard mask layer as an etching mask, wherein the first opening extends into the dielectric layer; filling the first opening with a conductive material to form a conductive feature; and removing the metal-containing hard mask layer. In an embodiment, the forming the metal-containing hard mask layer comprises depositing a tungsten-containing compound layer comprising a metal and an element selected from the group consisting essentially of carbon, nitrogen, and combinations thereof. In an embodiment, the forming the metal-containing hard mask layer comprises depositing a tungsten carbide layer. In an embodiment, the forming the metal-containing hard mask layer comprises depositing a tungsten carbo-nitride layer. In an embodiment, the forming the metal-containing hard mask layer comprises depositing a tungsten layer. In an embodiment, the method comprises forming a plurality of mandrels over the metal-containing hard mask layer; forming a plurality of spacers on sidewalls of the plurality of mandrels; and removing one of the mandrels between two of the spacers, with a space left by the one of the mandrels, wherein the first opening is directly underlying the space. In an embodiment, the method comprises forming a plurality of mandrels over the metal-containing hard mask layer; and forming a plurality of spacers on sidewalls of the plurality of mandrels, with a space between two of the spacers, wherein the first opening is directly underlying the space. In an embodiment, the first opening extending into the dielectric layer forms a trench, and the method further comprises forming a patterned photo resist over the metal-containing hard mask layer; and forming a via opening in the dielectric layer, with the via opening under the first opening, wherein in the forming the via opening, the patterned photo resist and the metal-containing hard mask layer are used in combination as an additional etching mask. In an embodiment, the method comprises patterning the metal-containing hard mask layer to form a second opening in the metal-containing hard mask layer, wherein the first opening and the second opening are formed in separate etching processes, and extend into the dielectric layer simultaneously.

In accordance with some embodiments of the present disclosure, a method comprises depositing a metal-containing hard mask layer over a dielectric layer, wherein the metal-containing hard mask layer has a tensile stress greater than about 600 MPa; forming a plurality of mandrels over the metal-containing hard mask layer; forming a plurality of spacers on sidewalls of the plurality of mandrels; etching the metal-containing hard mask layer to form a first trench in the metal-containing hard mask layer, wherein the first trench is overlapped by a first space between two of the plurality of spacers; etching one of the plurality of mandrels to leave a second space; etching the metal-containing hard mask layer to form a second trench in the metal-containing hard mask layer, wherein the second trench is overlapped by the second space; and etching the dielectric layer to extend the first trench and the second trench into the dielectric layer. In an embodiment, the method comprises depositing a first mask layer over the dielectric layer, wherein the metal-containing hard mask layer is deposited over the first mask layer; and depositing a second mask layer over the metal-containing hard mask layer, wherein the plurality of mandrels and the plurality of spacers are formed over the second mask layer, and wherein the first trench and the second trench are stopped on the first mask layer. In an embodiment, the depositing the metal-containing hard mask layer comprises depositing a tungsten layer. In an embodiment, the depositing the metal-containing hard mask layer comprises depositing a tungsten carbide layer. In an embodiment, the depositing the metal-containing hard mask layer comprises depositing a ruthenium-containing layer. In an embodiment, wherein the depositing the metal-containing hard mask layer is performed through a plasma enhanced chemical vapor deposition process. In an embodiment, the depositing the metal-containing hard mask layer is performed through a physical vapor deposition process.

In accordance with some embodiments of the present disclosure, a method comprises depositing a low-k dielectric layer; depositing a first mask layer over the low-k dielectric layer; depositing a tungsten-containing hard mask layer over the first mask layer; depositing a second mask layer over the tungsten-containing hard mask layer; forming a patterned photo resist over the second mask layer; using the patterned photo resist to etch the second mask layer and the tungsten-containing hard mask layer, so that a trench is formed in the tungsten-containing hard mask layer, wherein a top surface of the first mask layer is underlying and exposed to the trench; and transferring the trench in the tungsten-containing hard mask layer into the low-k dielectric layer. In an embodiment, the depositing the tungsten-containing hard mask layer comprises depositing a tungsten carbide layer. In an embodiment, the depositing the tungsten-containing hard mask layer comprises depositing a tungsten layer. In an embodiment, the depositing the tungsten-containing hard mask layer is performed using plasma enhanced chemical vapor deposition, with a power of plasma being adjusted so that a tensile stress in the tungsten-containing hard mask layer is greater than about 1,000 MPa.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a metal-containing hard mask layer over a dielectric layer;
   forming a plurality of mandrels over the metal-containing hard mask layer;
   forming a plurality of spacers on sidewalls of the plurality of mandrels;
   in a first patterning process, patterning the metal-containing hard mask layer to form a first opening in the metal-containing hard mask layer, wherein the first opening is directly underlying a space between two of the plurality of spacers, and wherein the first opening extends from top surfaces of the plurality of spacers to, and stops on, a second top surface of a first non-metal containing layer underlying the metal-containing hard mask layer;
   in a second patterning process, removing a part of one of the plurality of mandrels to form a second opening extending into the metal-containing hard mask layer, wherein the second opening stops on the second top surface;
   after the first opening and the second opening stopping on the second top surface are formed, removing remaining portions of the plurality of mandrels and the plurality of spacers;
   etching the dielectric layer using the metal-containing hard mask layer as an etching mask, wherein both of the first opening and the second opening extend into the dielectric layer;
   filling the first opening with a conductive material to form a conductive feature; and
   removing the metal-containing hard mask layer.

2. The method of claim 1 further comprising depositing the first non-metal containing layer and a second non-metal containing layer, wherein the second non-metal containing layer is over the metal-containing hard mask layer.

3. The method of claim 2, wherein the forming the metal-containing hard mask layer comprises depositing elemental ruthenium.

4. The method of claim 2, wherein both of the first non-metal containing layer and the second non-metal containing layer are in physical contact with the metal-containing hard mask layer.

5. The method of claim 1, wherein the metal-containing hard mask layer has a Young's modulus higher than about 1,000 MPa.

6. The method of claim 1, wherein the first patterning process and the second patterning process are performed using a first photo resist and a second photo resist, respectively, and wherein the etching the dielectric layer is performed adopting a third photo resist.

7. The method of claim 1 further comprising: depositing a spacer layer on the plurality of mandrels, wherein the forming the plurality of mandrels comprises performing an anisotropic etching process on the spacer layer, wherein portions of the spacer layer on sidewalls of the plurality of mandrels form the plurality of spacers.

8. The method of claim 1, wherein the first opening extending into the dielectric layer forms a trench, and the method further comprises:

forming a patterned photo resist over the metal-containing hard mask layer; and forming a via opening in the dielectric layer, with the via opening under the first opening, wherein in the forming the via opening, the patterned photo resist and the metal-containing hard mask layer are used in combination as an additional etching mask.

9. A method comprising:

depositing a metal-containing hard mask layer over a dielectric layer;

forming a plurality of mandrels over the metal-containing hard mask layer;

forming a plurality of spacers on sidewalls of the plurality of mandrels;

in a first etching process, etching the metal-containing hard mask layer using a first photo resist to form a first trench in the metal-containing hard mask layer, wherein the first trench is overlapped by a first space between two of the plurality of spacers;

in a second etching process separate from the first etching process, etching a first mandrel of the plurality of mandrels using a second photo resist to leave a second space, wherein after the first mandrel is etched, a second mandrel of the plurality of mandrels remains;

etching the metal-containing hard mask layer to form a second trench in the metal-containing hard mask layer, wherein the second trench is overlapped by the second space, and the second mandrel is used as a part of an etching mask for the etching;

after both of the first etching process and the second etching process are performed, removing remaining portions of both of the plurality of mandrels and the plurality of spacers; and after the remaining portions of the plurality of mandrels and the plurality of spacers are removed, etching the dielectric layer to extend the first trench and the second trench into the dielectric layer, wherein the etching the dielectric layer comprises using a third photoresist.

10. The method of claim 9 further comprising:

depositing a first mask layer over the dielectric layer, wherein the metal-containing hard mask layer is deposited over the first mask layer; and depositing a second mask layer over the metal-containing hard mask layer, wherein the plurality of mandrels and the plurality of spacers are formed over the second mask layer, and wherein the first trench and the second trench are stopped on the first mask layer.

11. The method of claim 10 further comprising:

depositing a spacer layer on the plurality of mandrels; and when all of top surfaces of the spacer layer are exposed, performing an anisotropic etching process to pattern the spacer layer and to form the plurality of spacers, wherein the second mask layer is revealed by the anisotropic etching process.

12. The method of claim 9, wherein the depositing the metal-containing hard mask layer comprises depositing a tungsten carbide layer.

13. The method of claim 9, wherein the depositing the metal-containing hard mask layer comprises depositing a ruthenium-containing layer.

14. The method of claim 9, wherein the depositing the metal-containing hard mask layer is performed through a plasma enhanced chemical vapor deposition process.

15. The method of claim 9, wherein the depositing the metal-containing hard mask layer is performed through a physical vapor deposition process.

16. A method comprising:

depositing a low-k dielectric layer;

depositing a first mask layer over the low-k dielectric layer;

depositing a tungsten-containing hard mask layer over the first mask layer;

depositing a second mask layer over the tungsten-containing hard mask layer;

forming a plurality of mandrels over the second mask layer;

forming a plurality of spacers on sidewalls of the plurality of mandrels;

forming a first patterned photo resist over the second mask layer;

using the first patterned photo resist to etch the second mask layer and the tungsten-containing hard mask layer, so that a first trench is formed in the tungsten-containing hard mask layer and between two neighboring ones of the plurality of spacers, and the first trench stops on a top surface of the first mask layer;

forming a second patterned photo resist over the second mask layer;

using the second patterned photo resist to etch one of the plurality of mandrels, so that a second trench is formed to extend into the tungsten-containing hard mask layer, wherein a top surface of the first mask layer is underlying and exposed to the first trench and the second trench, and the second trench stops on the top surface of the first mask layer;

etching the low-k dielectric layer using a third photo resist to form a via opening, wherein the via opening is formed in the first trench, and extends from the top surface of the first mask layer to an intermediate level of the low-k dielectric layer; and transferring the first trench in the tungsten-containing hard mask layer into the low-k dielectric layer, wherein during the transferring, the via opening is extended to a bottom of the low-k dielectric layer.

17. The method of claim 16, wherein the depositing the tungsten-containing hard mask layer comprises depositing a tungsten carbide layer.

18. The method of claim 16, wherein the depositing the tungsten-containing hard mask layer comprises depositing a tungsten layer.

19. The method of claim 16 further comprising, after the first trench and the second trench are formed and before the via opening is formed, removing remaining portions of the plurality of mandrels and the plurality of spacers.

* * * * *